(12) United States Patent
Facchetti et al.

(10) Patent No.: US 9,825,261 B2
(45) Date of Patent: Nov. 21, 2017

(54) ORGANIC ELECTROLUMINESCENT TRANSISTOR

(71) Applicants: Flexterra, Inc., Skokie, IL (US);
E.T.C. S.R.L., Lainate (IT)

(72) Inventors: Antonio Facchetti, Chicago, IL (US);
Hakan Usta, Kayseri (TR); Mitchell Denti, Chicago, IL (US); Viviana Biondo, Illegio Tolmezzo (IT);
Caterina Soldano, Faenza (IT);
Michele Muccini, Bologna (IT)

(73) Assignees: Flexterra, Inc., Skokie, IL (US);
E.T.C. S.R.L., Lainate, Milan (IT)

( * ) Notice: Subject to any disclaimer, the term of this patent is extended or adjusted under 35 U.S.C. 154(b) by 0 days.

(21) Appl. No.: 15/414,513

(22) Filed: Jan. 24, 2017

(65) Prior Publication Data
US 2017/0237043 A1    Aug. 17, 2017

Related U.S. Application Data

(63) Continuation of application No. PCT/US2015/042052, filed on Jul. 24, 2015.

(60) Provisional application No. 62/028,399, filed on Jul. 24, 2014.

(30) Foreign Application Priority Data

Jul. 24, 2014    (EP) .................................... 14425099

(51) Int. Cl.
| | | |
|---|---|---|
| H01L 51/54 | (2006.01) | |
| H01L 51/52 | (2006.01) | |
| H01L 27/32 | (2006.01) | |
| H01L 51/50 | (2006.01) | |
| H01L 51/00 | (2006.01) | |

(52) U.S. Cl.
CPC ...... *H01L 51/5296* (2013.01); *H01L 27/3244* (2013.01); *H01L 27/3281* (2013.01); *H01L 51/5203* (2013.01); H01L 51/0061 (2013.01); H01L 51/0068 (2013.01); H01L 51/0072 (2013.01); H01L 51/0074 (2013.01); H01L 51/0085 (2013.01); H01L 51/5012 (2013.01); H01L 51/5056 (2013.01); H01L 51/5072 (2013.01)

(58) Field of Classification Search
CPC .. C07D 331/00; C07D 333/00; C07D 495/00; C07D 495/02; C07D 495/04; C07D 495/06; C07D 497/00; C07D 497/02; C07D 497/04; C07D 497/06; H01L 51/00; H01L 51/0032; H01L 51/005; H01L 51/0051; H01L 51/0061; H01L 51/0062; H01L 51/0068; H01L 51/0071; H01L 51/0072; H01L 51/0073; H01L 51/0074; H01L 51/079; H01L 51/0084; H01L 51/0085; H01L 51/50; H01L 51/5012; H01L 51/5016; H01L 51/5056; H01L 51/5072; H01L 51/5296; H01L 51/5203; H01L 27/3244; H01L 27/3281
USPC ....... 428/690, 691, 917, 411.4, 336; 427/58, 427/66; 313/500–512; 257/40, 88–104, 257/E51.001–E51.052; 252/301.16–301.35
See application file for complete search history.

(56) References Cited

PUBLICATIONS

Raffaella Capelli et al., "Organic light-emitting transistors with an efficiency that outperforms the equivalent light-emitting diodes", *Nature Materials*, 9(6): 496-503, 2010.
Yu-Chang Chang et al., "Crystal Engineering for [pi]-[pi] Stacking via Interaction between Electron-Rich and Electron-Deficient Heteroaromatics", *J. Org. Chem.*, 73(12): 4608-4614, 2008.

*Primary Examiner* — Andrew K Bohaty
(74) *Attorney, Agent, or Firm* — McDonnell Boehnen Hulbert & Berghoff LLP

(57) ABSTRACT

The present teachings relate to an organic electroluminescent transistor with improved light-emission characteristics. More specifically, the present organic electroluminescent transistor has an emissive ambipolar channel including at least one layer of an n-type semiconductor material, at least one layer of a p-type semiconductor material, and at least one layer of an emissive material arranged between the layers of the p-type and n-type semiconductor materials, with the n-type semiconductor material comprising an electron-transporting compound represented by formula (N-1):

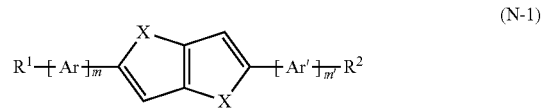

(N-1)

where X, Ar, Ar', $R^1$, $R^2$, m and m' are as defined herein.

20 Claims, 8 Drawing Sheets

ORGANIC ELECTROLUMINESCENT TRANSISTOR

CROSS-REFERENCE TO RELATED APPLICATIONS

This is a continuation of International Application No. PCT/US2015/042052 filed on Jul. 24, 2015, which claims priority to and the benefit of the filing dates of U.S. Provisional Patent Application Ser. No. 62/028,399 filed on Jul. 24, 2014, and European Patent Application Serial No. 14425099.0 filed on Jul. 24, 2014, the entire disclosure of each of which is incorporated by reference herein for all purposes.

BACKGROUND

Organic electroluminescent field effect transistors, also known as OLETs (Organic Light-Emitting Transistors), are a relatively recent type of devices that combine the switching mechanism of a thin-film transistor and an electroluminescent device. While charge transport occurs perpendicular to the organic layers in OLEDs (Organic Light-Emitting Diodes), the majority of the current flows horizontally through the semiconducting layers in OLETs. As a result, light in OLETs can be emitted as a stripe along the emissive layer, rather than uniformly through the electrode areas as in conventional OLEDs. The planar transport geometry of OLETs helps suppress deleterious photon losses and exciton quenching mechanisms inherent in the OLED architecture. Accordingly, the same organic electroluminescent light-emitting material has been shown to achieve much higher external quantum efficiency (EQE) and luminosity in an OLET than in an equivalent OLED.

European Patent No. EP 1609195 describes an OLET which has an ambipolar channel that can be realized by one layer or several coplanar layers of organic semiconductor(s). Further details about the functional characteristics of such OLETs and their advantages over OLEDs can be found in Capelli et al., "Organic light-emitting transistors with an efficiency that outperforms the equivalent light-emitting diodes," Nature Materials, vol. 9, pages 496-503 (2010).

So far, various studies and characterizations of OLETs have shown that enhanced luminosity can be obtained at bias conditions where the efficiency of charge current conversion into light emission tends to be very low (in the order of $1 \times 10^{-1}$%). Conversely, device efficiency usually can be maximized by modifying the bias conditions but with detrimental effects on luminosity. Such limitations significantly reduce the usefulness of current state-of-the-art OLETs in applications when both high brightness and high efficiency are needed simultaneously. Further improvement in electroluminescence intensity (from the order of nanowatt (nW) to microwatt (µW) without changing the device geometry) also is desirable.

SUMMARY

An objective of the present teachings, therefore, is to provide an organic electroluminescent transistor that can overcome the above-mentioned drawbacks in the prior art, particularly, to maximize simultaneously the light emission efficiency and brightness of the OLET and of the device containing it.

Generally, the present teachings relate to an organic electroluminescent transistor having at least one dielectric layer, at least one control electrode, at least one hole electrode, at least one electron electrode, and an assembly that has an emissive ambipolar channel, wherein the dielectric layer is arranged between the control electrode and the assembly, and wherein the emissive ambipolar channel includes at least one layer of an n-type semiconductor material, at least one layer of a p-type semiconductor material, and at least one layer of an emissive material arranged between the layers of the p-type and n-type semiconductor materials. Particularly, the n-type semiconductor material comprises an electron-transporting compound represented by formula (N-1):

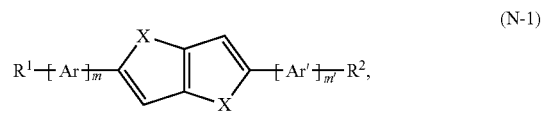

wherein:
X is selected from the group consisting of O, S, and Se;
Ar and Ar', at each occurrence, independently are identical or different monocyclic aryl or heteroaryl groups;
$R^1$ and $R^2$ independently are identical or different electron-withdrawing groups selected from the group consisting of —CN, $R^a$, —C(O)$R^b$, and —C(O)O$R^b$; wherein $R^a$ is a $C_{1-20}$ alkyl, $C_{2-20}$ alkenyl, or $C_{2-20}$ alkynyl group substituted with at least one fluoro or cyano group; and $R^b$ is selected from the group consisting of H, a $C_{1-20}$ alkyl group, a $C_{2-20}$ alkenyl group, and a $C_{2-20}$ alkynyl group, wherein each of the $C_{1-20}$ alkyl group, the $C_{2-20}$ alkenyl group, and the $C_{2-20}$ alkynyl group optionally is substituted with one or more fluoro and/or cyano groups; and
m and m' independently are 1 or 2.

In preferred embodiments, Ar and Ar' are phenyl groups, and $R^1$ and $R^2$ are $C_{1-20}$ fluoroalkyl groups.

In some embodiments, the p-type semiconductor material can comprise a hole-transporting compound such as an oligothiophene, an acene, or a fused heteroarene. Examples of oligothiophenes include dithiophenes and quaterthiophenes. Examples of acenes include pentacene and anthracene. Examples of fused heteroarenes (particularly those comprising at least one thiophene ring) include thienothiophenes, benzothiophenes, naphthothiophenes, benzothieno[3,2-b][1]benzothiophenes, and dinaphtho[2,3-b:2',3'-f]thieno[3,2-b]thiophenes. The foregoing examples of p-type semiconductor materials can be optionally α- and/or ω-substituted with hydrocarbon group(s).

In some embodiments, the emissive layer can be a blend material composed of a host matrix compound and a guest emitter. Preferred host matrix compounds include carbazole derivatives such as 4,4',4"-tris(carbazole-9-yl)triphenylamine (TCTA), 4'-bis(3,6-dineopentyl-9H-carbazole-9-yl)-1,1'-biphenyl (NP4-CBP), and 4,4'-bis(N-carbazolyl)-1,1'-biphenyl (CBP). Preferred guest emitters include iridium-based emitters such as tris(1-phenylisoquinoline)iridium(III) (Ir(piq)$_3$), tris(2-phenylpyridine)iridium(III) (Ir(ppy)), and bis(4,6-difluorophenyl-pyridine)(picolinate)iridium(III) (Fl-rpic). More preferably, the emissive layer can be a blend material selected from the group consisting of 4,4',4"-tris(carbazole-9-yl)triphenylamine:tris(1-phenylisoquinoline)iridium(III) (TCTA:Ir(piq)$_3$), 4,4'-bis(3,6-dineopentyl-9H-carbazole-9-yl)-1,1'-biphenyl:tris(1-phenylisoquinoline)iridium(III) (NP4-CBP:Ir(piq)$_3$), 4,4'-bis(3,6-dineopentyl-9H-carbazole-9-yl)-1,1'-biphenyl:tris(2-phenylpyridine)iridium(III) (NP4-CBP:Ir(ppy)), and 4,4'-bis(3,6- dineopentyl-9H-carbazole-9-yl)-1,'-biphenyl:bis(4,6-difluorophenyl-pyridine)(picolinate)iridium(III) (NP4-CBP:FIrpic).

In various embodiments, the organic electroluminescent transistor can include one or more additional layers selected from the group consisting of a hole-injection sublayer, an electron-injection sublayer, and a passivation layer. For example, a hole-injection sublayer can be interposed between the hole electrode and the layer of p-type semiconductor material and/or an electron-injection sublayer can be interposed between the electron electrode and the layer of n-type semiconductor material. In certain embodiments, the hole electrode can be in contact with the layer of p-type semiconductor material and the electron electrode can be in contact with the layer of n-type semiconductor material.

The foregoing as well as other features and advantages of the present teachings will be more clearly understood from the following figures, description, examples, and claims. The claims as filed are an integral part of this specification and are herein incorporated by reference.

DETAILED DESCRIPTION

Figure 1:
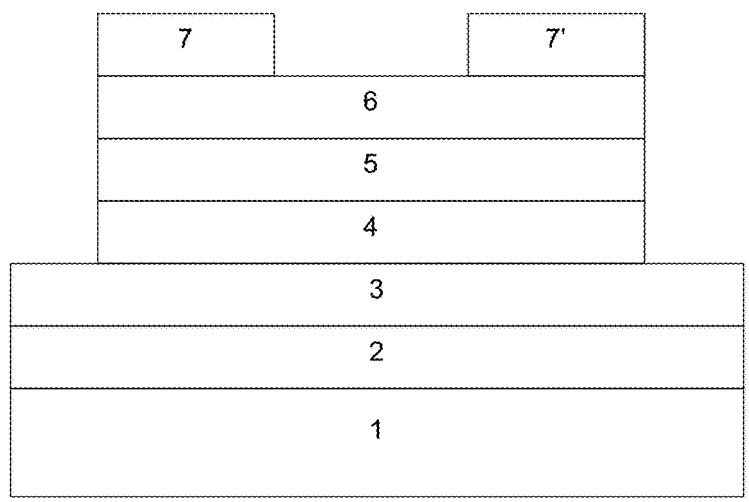
FIG. 1 is a cross-sectional view of an organic electroluminescent field effect transistor (OLET) according to an embodiment of the present teachings, which includes a substrate (1), a control electrode (2), a dielectric layer (3), an assembly comprising an emissive ambipolar channel that includes a layer of a first-type of semiconductor material (4), a layer of an emissive material (5), a layer of a second-type of semiconductor material (6), and an electron electrode and a hole electrode (7 and 7').

FIG. 1 shows the structure of an organic electroluminescent transistor (OLET) according to an embodiment of the present teachings. In this particular embodiment, the OLET includes a substrate 1 that acts as a supporting layer, over which there is an electrode 2 that acts as the control (or gate) electrode and that may be a transparent electrode, and a layer of dielectric material 3, over which there is a light-emitting assembly. The light-emitting assembly generally includes a charge carrier transport layer of a first type 4, a layer 5 of emissive material, and a charge carrier transport layer of a second type 6. The charge carrier transport layer of the first type 4, for example, can be a hole transport layer made of a p-type semiconductor material and the charge carrier transport layer of the second type 6 can be an electron transport layer made of an n-type semiconductor material, although an inverted assembly (with layer 4 being an electron transport layer made of an n-type semiconductor material and layer 6 being a hole transport layer made of a p-type semiconductor material) also can be used. Hole and electron electrodes 7 and 7' are realized so as to inject charge carriers into the light-emitting assembly. In the shown embodiment, the hole and electron electrodes are directly in contact with the charge carrier transport layer of the second type 6. According to certain embodiments (not shown), an injection sublayer (i.e., a hole-injection sublayer) can be interposed between the hole electrode and the layer 6 in embodiments where the layer 6 is a layer of p-type semiconductor material. In embodiments where the layer 6 is a layer of n-type semiconductor material, an injection sublayer (i.e., an electron-injection sublayer) can be interposed between the electron electrode and the layer 6.

As understood by those skilled in the art, the hole electrode and the electron electrode can function, respectively, as the source electrode and the drain electrode (or vice versa) depending on the polarity of the gate voltage. Briefly, because the source electrode is typically grounded (0 V), if the gate voltage is −100V and the drain voltage is −80V, then the source electrode is the hole electrode (negatively biased) and the drain electrode is the electron electrode (positively biased). On the other hand, if the gate voltage is +100V, the source electrode is the electron electrode and the drain electrode is the hole electrode. An OLET typically is operated by applying a first appropriate bias voltage to the gate electrode, and injecting electrons from the electron electrode and holes from the hole electrode, while maintaining a second bias voltage between the latter two electrodes. In some embodiments, the first and second bias voltages can be continuous voltages. In other embodiments, the first and second bias voltages can be pulsed voltages.

Instead of the bottom-gate architecture depicted in FIG. 1, an OLET can have a top-gate architecture. Further, the hole and electron electrodes and/or the control electrode can have alternative arrangements as described in International Publication No. WO 2014/035841. Specifically, the hole and electron electrodes can be in contact with different layers of the light-emitting assembly. For example, the hole electrode can be in contact with the layer of p-type semiconductor material, while the electron electrode can be in contact with the layer of n-type semiconductor material. Furthermore, as described in International Publication Nos. WO 2013/018002, WO 2013/017999, WO 2014/035842, and WO 2013/018000, additional control electrode(s) and/or additional layer(s) of dielectric material, emissive material, and/or charge carrier transport materials can be incorporated into the OLET. Optionally, a passivation layer can be present covering the top surface of the emissive ambipolar channel.

The inventors have found that the foregoing organic electroluminescent transistors can have enhanced light emission if the layer of n-type semiconductor material includes an electron-transporting compound represented by formula (N-1):

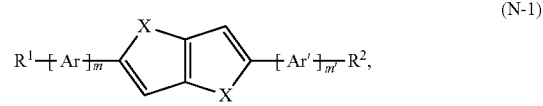

(N-1)

wherein:

X is selected from the group consisting of O, S, and Se;

Ar and Ar', at each occurrence, independently are identical or different monocyclic aryl or heteroaryl groups;

$R^1$ and $R^2$ independently are identical or different electron-withdrawing groups selected from the group consisting of —CN, $R^a$, —C(O)$R^b$, and —C(O)O$R^b$;

wherein $R^a$ is a $C_{1-20}$ alkyl, $C_{2-20}$ alkenyl, or $C_{2-20}$ alkynyl group substituted with at least one fluoro or cyano group; and $R^b$ is selected from the group consisting of H, a $C_{1-20}$ alkyl group, a $C_{2-20}$ alkenyl group, and a $C_{2-20}$ alkynyl group, wherein each of the $C_{1-20}$ alkyl group, the $C_{2-20}$ alkenyl group, and the $C_{2-20}$ alkynyl group optionally is substituted with one or more fluoro and/or cyano groups; and m and m' independently are 1 or 2.

For example, $R^1$ and $R^2$ can be $R^a$ which is selected from the group consisting of (i) a $C_{1-20}$ alkyl group substituted with one or more F or CN groups having the general formula $C_xF_yH_{2x+1-y}$ or $C_xCN_yH_{2x+1-y}$, provided that x is an integer ranging between 1 and 20, y is an integer ranging between 1 and 41, and y≤2x+1; (ii) a $C_{2-20}$ alkenyl group substituted with one or more F or CN groups having the general formula $C_xF_yH_{2x-1-y}$ or $C_xCN_yH_{2x-1-y}$, provided that x is an integer ranging between 2 and 20, y is an integer ranging between 1 and 39, and y≤2x−1; (iii) a $C_{2-20}$ alkynyl group substituted with one or more F or CN groups having the general formula $C—F_yH_{2x-3-y}$ or $C_xCN_yH_{2x-3-y}$, provided that x is an integer ranging between 2 and 20, y is an integer ranging between 1 and 37, and y≤2x−3. In certain embodiments, $R^1$ and $R^2$ can be a $C_{1-20}$ alkyl group substituted with one or more F groups having the general formula $C_xF_yH_{2x+1-y}$, provided that x is an integer ranging between 1 and 20, y is an integer ranging between 1 and 41, and y≤2x+1. In particular embodiments, $R^1$ and $R^2$ can be a $C_{1-18}$ perfluoroalkyl group having the general formula $C_nF_{2n+i}$, provided that n is an integer ranging between 1 and 20. In alternative embodiments, $R^1$ and $R^2$ can be a $C_{2-20}$ perfluoroalkenyl or perfluoroalkynyl group having, respectively, the general formula $C_nF_{2n-1}$ or $C_nF_{2n-3}$, provided that n is an integer ranging between 2 and 20.

In other embodiments, $R^1$ and $R^2$ can be —C(O)$R^b$ or —C(O)O$R^b$, where $R^b$ is selected from the group consisting of (i) H, (ii) a $C_{1-18}$ alkyl group optionally substituted with one or more F or CN groups having the general formula $C_xF_yH_{2x+1-y}$ or $C_xCN_yH_{2x+1-y}$, provided that x is an integer ranging between 1 and 20, y is an integer ranging between 0 and 41, and y≤2x+1 (ii) a $C_{2-18}$ alkenyl group optionally substituted with one or more F or CN groups having the general formula $C_xF_yH_{2x-1-y}$ or $C_xCN_yH_{2x-1-y}$, provided that x is an integer ranging between 2 and 20, y is an integer ranging between 0 and 39, and y≤2x−1; and (iii) a $C_{2-18}$ alkynyl group substituted with one or more F or CN groups having the general formula $C_xF_yH_{2x-3-y}$ or $C_xCN_yH_{2x-3-y}$, provided that x is an integer ranging between 2 and 20, y is an integer ranging between 0 and 37, and y≤2x−3.

In preferred embodiments, the electron-transporting compound can be represented by formula (N-2):

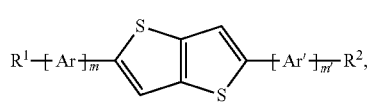

(N-2)

wherein Ar, Ar', $R^1$, $R^2$, m and m' are as defined herein.

In more preferred embodiments, the electron-transporting compound can be represented by formula (N-3):

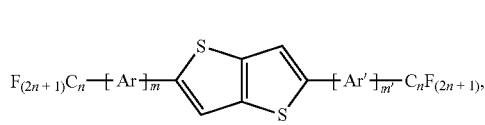

(N-3)

wherein n is an integer ranging from 1 to 12 (inclusive), preferably, from 4 to 12 (inclusive), and wherein Ar, Ar', m and m' are as defined herein.

In any of the foregoing embodiments, Ar and Ar', at each occurrence, independently can be selected from the group consisting of a phenyl group, a thienyl group, a thiazolyl group, an isothiazolyl group, a thiadiazolyl group, a furyl group, an oxazolyl group, an isoxazolyl group, an oxadiazolyl group, a pyrrolyl group, a triazolyl group, a tetrazolyl group, a pyrazolyl group, an imidazolyl group, a pyridyl group, a pyrimidyl group, a pyridazinyl group, and a pyrazinyl group.

In particular embodiments, the electron-transporting compound can be represented by formula (N-4):

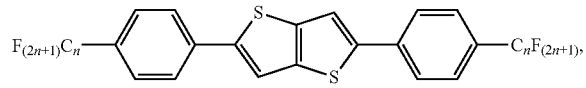

(N-4)

wherein n is an integer ranging from 1 to 12 (inclusive), and preferably, from 4 to 12 (inclusive).

In one specific embodiment, the electron-transporting compound can be 2,5-bis(4-(perfluorooctyl)phenyl)thieno[3,2-b]thiophene (N-F2-6):

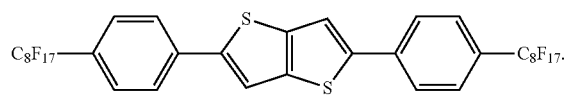

In another specific embodiment, the electron-transporting compound can be 2,5-bis(4-(trifluoromethyl)phenyl)thieno[3,2-b]thiophene (N-F2-6-CF3):

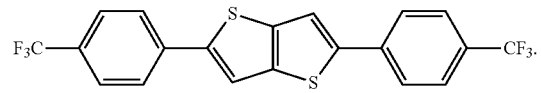 [SMILES: FC(F)(F)c1ccc(-c2cc3sc(-c4ccc(C(F)(F)F)cc4)cc3s2)cc1]

The inventors also have found that the foregoing organic electroluminescent transistors can have further enhanced emissive properties if the layer of p-type semiconductor material includes a hole-transporting compound selected from the group consisting of an oligothiophene, an acene, and a fused heteroarene. In some embodiments, the p-type semiconductor material can include a hole-transporting compound selected from the group consisting of a dithiophene, a quaterthiophene, a thienothiophene, a benzothiophene, a naphthothiophene, a benzothieno[3,2-b][1]benzothiophene, and a dinaphtho[2,3-b:2',3'-f]thieno[3,2-b]thiophenes, each of which can be optionally α- and/or ω-substituted with hydrocarbon group(s). In certain embodiments, the p-type semiconductor material can include a hole-transporting compound represented by formula (P-1), (P-2), (P-3), (P-4), (P-5) or (P-6):

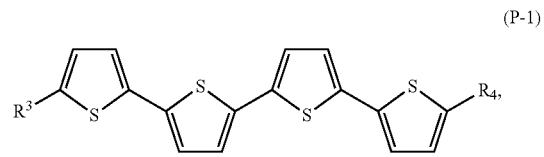

(P-1)

(P-2)

(P-3)

(P-4)

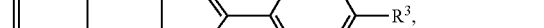

(P-5), or

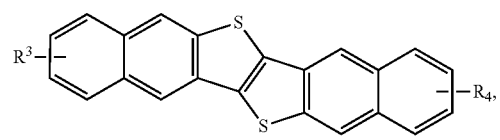

(P-6)

wherein $R^3$ and $R^4$ independently are H or identical or different $C_{1-20}$ alkyl groups. In particular embodiments, the p-type semiconductor material can include a hole-transporting compound selected from the group consisting of:

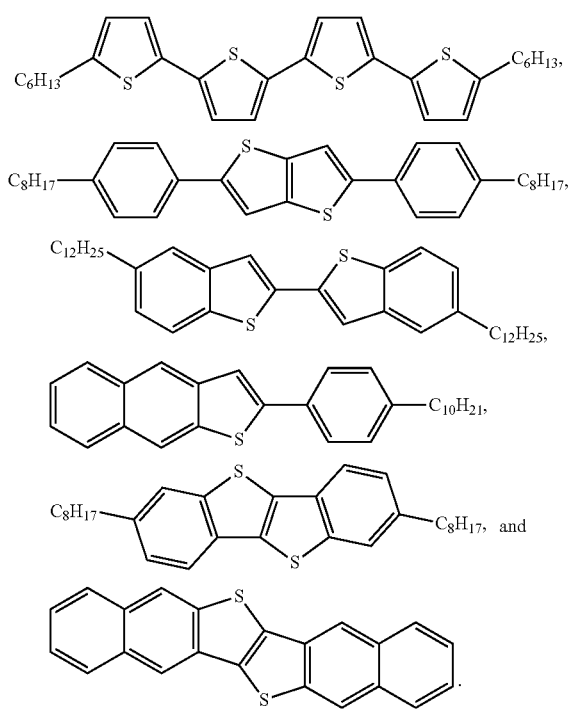

Further enhanced emissive properties also may be obtained if the emissive material comprises a blend of a hole matrix compound represented by either formula (H-1) (TCTA), formula (H-2) (NP4-CBP) or formula (H-3) (CBP), and a guest emitter represented by formula (G-1) (FIrpic), (G-2) (Ir(ppy)), or (G-3) (Ir(piq)$_3$) as provided below. In various embodiments, the layer of emissive material can include between 5% and 22% of its total weight of the guest emitter.

For example, in embodiments where the emissive material is blue-emitting, the emissive material can include a blend of the arylamine matrix compound of formula (H-1) and the blue emitter of formula (G-1):

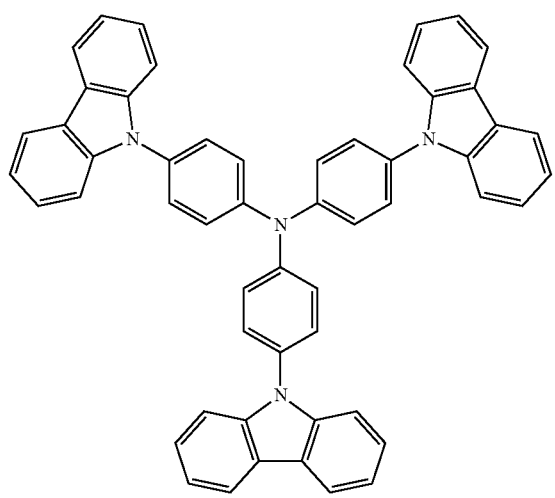
(H-1)

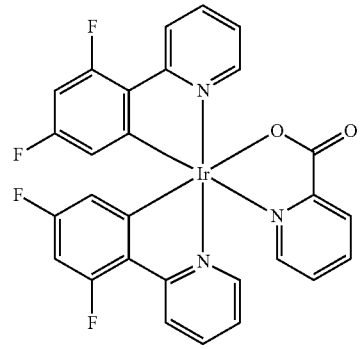
(G-1)

or a blend of the arylamine matrix compound of formula (H-2) and the blue emitter of formula (G-1):

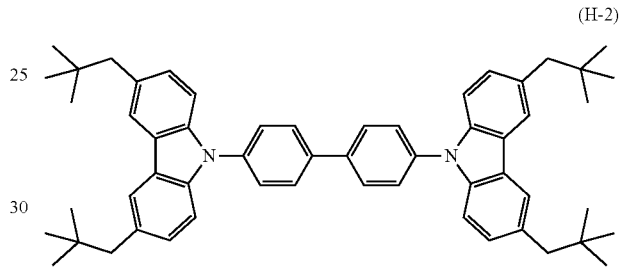
(H-2)

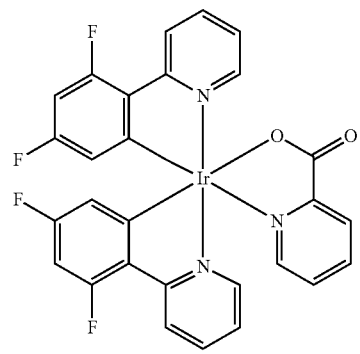
(G-1)

or a blend of the arylamine matrix compound of formula (H-3) and the blue emitter of formula (G-1):

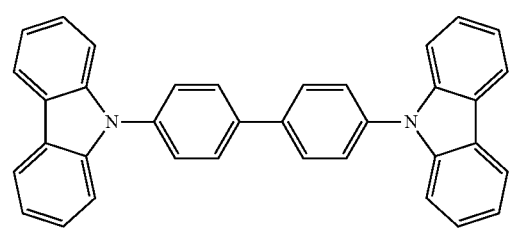
(H-3)

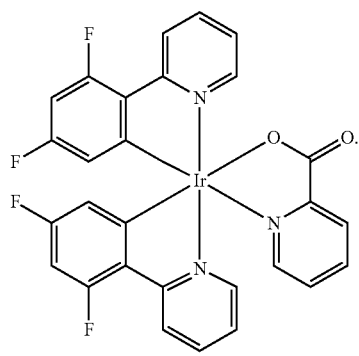
(G-1)

In embodiments where the emissive material is green-emitting, the emissive material can include a blend of the arylamine matrix compound of formula (H-1) and the green emitter of formula (G-2):

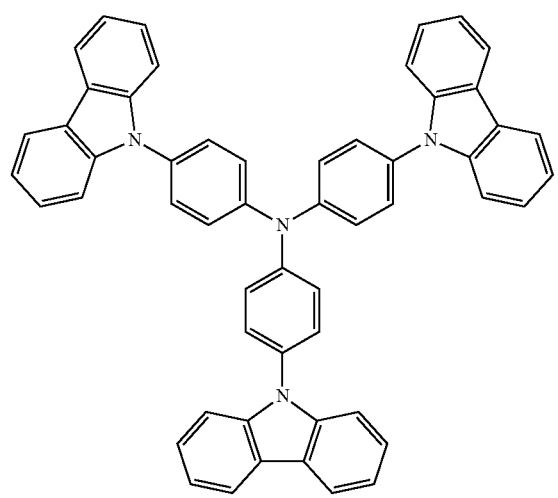
(H-1)

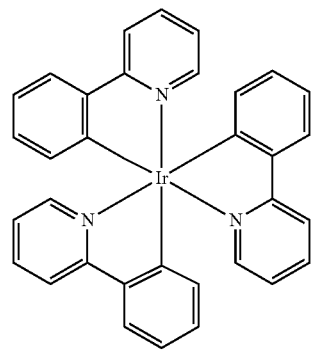
(G-2)

or a blend of the arylamine matrix compound of formula (H-2) and the green emitter of formula (G-2):

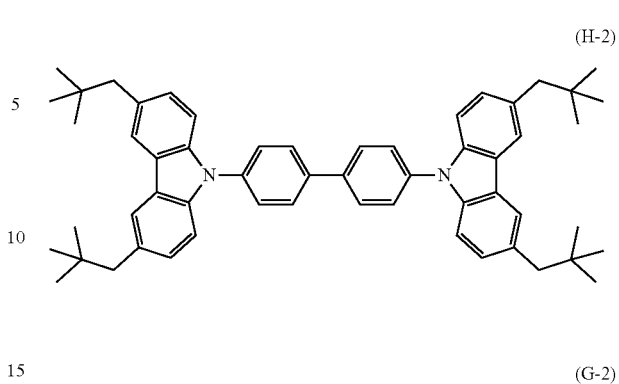
(H-2)

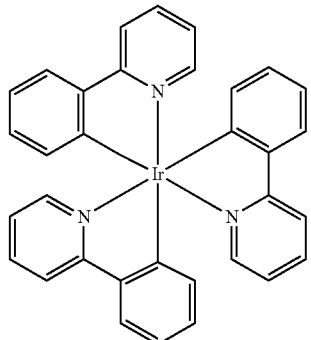
(G-2)

or a blend of the arylamine matrix compound of formula (H-3) and the green emitter of formula (G-2):

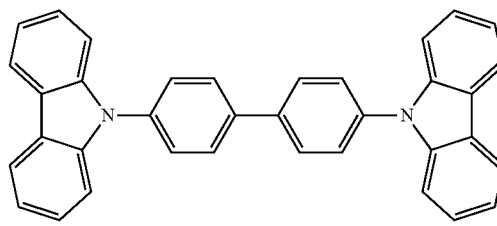
(H-3)

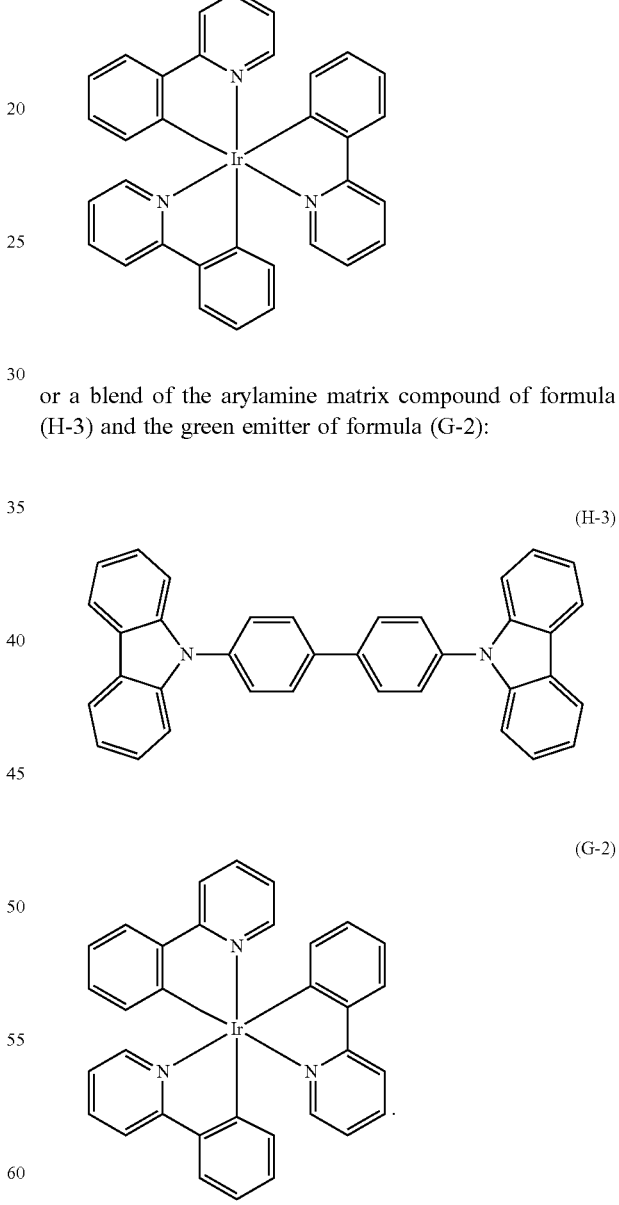
(G-2)

In embodiments where the emissive material is red-emitting, the emissive material can include a blend of the arylamine matrix compound of formula (H-1) and the red emitter of formula (G-3):

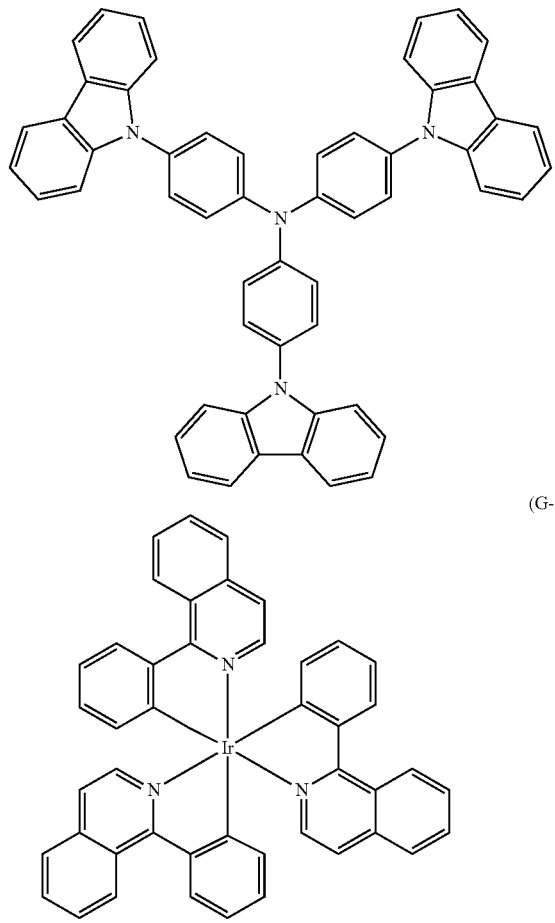

(H-1)

or a blend of the arylamine matrix compound of formula (H-2) and the red emitter of formula (G-3):

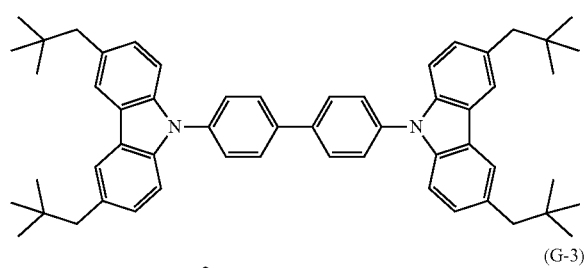

(H-2)

(G-3)

or a blend of the arylamine matrix compound of formula (H-3) and the red emitter of formula (G-3):

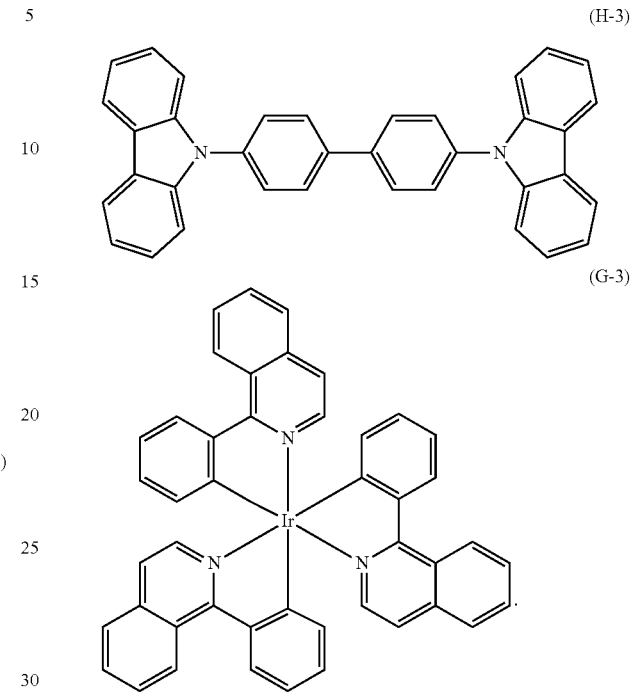

(H-3)

(G-3)

However, the emissive material can be selected from various single-component host-emitting materials and blend materials including a host matrix compound and a guest fluorescent or phosphorescent emitter known in the art. Suitable organic electroluminescent light-emitting materials include those having been used in OLED applications. For example, an alternative emissive material can be a blend of host tris(8-hydroxyquinolinato)aluminium (Alq$_3$) and guest 4-(dicyanomethylene)-2-methyl-6-(p-dimethylaminostyryl)-4H-pyran (DCM).

Various examples of host materials, guest emitters, and single-component host-emitting materials are described in Chaskar et al., "Bipolar Host Materials: A Chemical Approach for Highly Efficient Electrophosphorescent Devices," *Adv. Mater.*, 23(34): 3876-3895 (2011); Tao et al., "Organic host materials for phosphorescent organic light-emitting diodes," *Chem. Soc. Rev.*, 40(5): 2943-2970 (2011); Sasabe et al., "Multifunctional Materials in High-Performance OLEDs: Challenges for Solid-State Lighting," *Chem. Mater.*, 23(3): 621-630 (2011); Tsuboi, "Recent advances in white organic light emitting diodes with a single emissive dopant," *J. Non-Cryst. Solids*, 356(37-40): 1919-1927 (201); Singh et al., "Bio-organic optoelectronic devices using DNA," *Adv. Polym. Sci.*, 223 (Organic Electronics): 189-212 (2010); Kappaun et al., "Phosphorescent organic light-emitting devices: working principle and iridium based emitter materials," *Int. J. Mol. Sci.*, 9(8): 1527-1547 (2008); Tokito et al., "Phosphorescent organic light-emitting devices: triplet energy management," *Electrochemistry*, 76(1): 24-31 (2008); Chen, "Evolution of Red Organic Light-Emitting Diodes: Materials and Devices," *Chem. Mater.*, 16(23): 4389-4400 (2004); Liu et al., "Polyfluorenes with on-chain metal centers," *Adv. Poly. Sci.*, 212 (Polyfluorenes): 125-144 (2008); Danev et al., "Vacuum deposited polyimide—a perfect matrix for nanocomposite materials," *J. Optoelec-* tron. *Adv. Mater.,* 7(3): 1179-1190 (2005); U.S. Pat. Nos. 5,747,183; 5,683,823; 6,626,722; 7,074,502; 7,671,241; and 7,772,762.

To illustrate, some exemplary host-emitting materials include phosphorescent host-emitting compounds based on carbazole derivatives, fluorene derivatives, or 9-naphthylanthracene derivatives, and fluorescent host-emitting compounds based on organometallic chelates such as tris(8-quinolinol) aluminum complexes. Some exemplary host materials include polymers such as poly(p-phenylene vinylene), poly(alkyphenylphenylvinylene), poly(alkyphenylphenylvinylene-co-alkoxyphenylenevinylene), polyfluorene, poly(n-vinylcarbazole), and copolymers thereof. Various carbazole compounds, triphenylamine compounds, including hybrids with oxadiazole or benzimidazole also have been used as host materials.

Some exemplary guest emitters (light-emitting dyes or dopants) include fluorescent dyes such as various perylene derivatives, anthracene derivatives, rubrene derivatives, carbazole dervatives, fluorene derivatives, and quinacridone derivatives, and phosphorescent emitters such as various transition metal complexes including Ir, Os, or Pt. The inventors have found that light emission by the present OLET is further enhanced when the emissive layer is selected from the group consisting of $TCTA:Ir(piq)_3$, $NP4-CBP:Ir(piq)_3$, $NP4-CBP:Ir(ppy)$, and $NP4-CBP:FIrpic$.

The dielectric layer can be an electrically insulating material selected from the group consisting of an inorganic oxide or nitride, a molecular dielectric, a polymeric dielectric, and combination thereof. In embodiments where the dielectric layer is a metal oxide or nitride, such dielectric material can be selected from the group consisting of $SiO_2$, $Si_3N_4$, $Al_2O_3$, $ZrO_x$, Al-doped $ZrO_x$, and $HfO_x$. In embodiments where the dielectric layer is a molecular dielectric, such dielectric can be a self-assembled nanodielectric. In embodiments where the dielectric layer is a polymeric dielectric, such dielectric material can be selected from the group consisting of polyolefins, polyacrylates, polyimides, polyesters, and fluoropolymers. Hybrid organic/inorganic materials also may be used. In preferred embodiments, the dielectric layer comprises an organic dielectric, particularly, a polymeric dielectric.

OLETs according to the present teachings can be fabricated using processes known in the art. For example, organic layers (e.g., the layer of emissive material, the layers of p-type and n-type semiconductor materials, and the organic dielectric layer of certain embodiments) can be formed by vapor-phase processes such as chemical vapor deposition or physical vapor deposition, as well as solution-phase processes such as printing (e.g., flexo printing, litho printing, gravure printing, ink-j etting, pad printing, and so forth), drop casting, slot coating, dip coating, doctor blading, roll coating, or spin-coating.

The hole/electron and gate electrodes can be formed using conventional processing techniques. For example, any of the electrical contacts can be deposited through a mask, or can be deposited then etched or lifted off (photolithography). Suitable deposition techniques include electrodeposition, vaporization, sputtering, electroplating, coating, laser ablation and offset printing, from the same or different metals or metal alloys such as copper, aluminum, gold, silver, molybdenum, platinum, palladium, copper, titanium, chromium, and/or nickel, a transparent conducting oxide such as tin-doped indium oxide (ITO), or an electrically conductive polymer such as polyethylenethioxythiophene (PEDOT). Charge carrier injection can be facilitated by the use of a material for the injection electrode (hole electrode or electron electrode) that has a low barrier against injection of a charge carrier type into the hole transport sublayer and the electron transport sublayer, respectively. For example, the electron electrode can comprise one or more elements selected from the group consisting of Au, Ca, Mg, Al, In, and a perovskite manganites ($RE_{1-x}A_xMnO_3$, RE=rare earth element such as La, Nd, Pr etc., A=alkaline metal). The hole electrode can comprise at least one material selected from the group consisting of Au, indium tin oxide, Cr, Cu, Fe, Ag, poly(3,4-ethylenedioxthiophene) combined with poly(styrenesulfonate) (PEDOT:PSS), and a perovskite manganite ($Re_{1-x}A_xMnO_3$). In certain embodiments, the hole electrode and the electron electrode can be made of conductors with different work functions to favor both hole and electron injection.

If present, the hole and electron injection sublayers can be prepared by self-assembly of thiolates, phosphonates, or aliphatic or aromatic carboxylates; by thermal evaporation of various charge transfer complexes and other heteroaromatic or organometallic complexes; or by thermal evaporation or sputtering of various metal oxides, fluorides, or carbonates. The hole injection sublayer and the electron injection sublayer can be made of materials that provide a staircase of electronic levels between the energy level of the hole electrode and the electron electrode, and the energy level required for injection into the hole transport sublayer and the electron transport sublayer, respectively. See e.g., Li et al., "Low operating-voltage and high power-efficiency OLED employing $MoO_3$-doped CuPc as hole injection layer," *Displays,* 33(1): 17-20 (2012); Wen et al., "Self-assembled of conducting polymeric nanoparticles and its application for OLED hole injection layer," *Energy Procedia,* 12: 609-614 (2011); Zhang et al., "Role of $Fe_3O_4$ as a p-dopant in improving the hole injection and transport of organic light-emitting devices," *IEEE Journal of Quantum Electronics,* 47(5): 591-596 (2011); Choo et al., "Luminance and charge transport mechanisms for phosphorescent organic light-emitting devices fabricated utilizing a tris(2-phenylpyridine)iridium-doped N,N'-dicarbazolyl-3,5-benzene emitting layer," *Thin Solid Films,* 519(15): 5253-5256 (2011); Tao et al., "Odd-even modulation of electrode work function with self-assembled layer: Interplay of energy barrier and tunneling distance on charge injection in organic light-emitting diodes," *Organic Electronics,* 12(4): 602-608 (2011); Sung et al., "AC Field-Induced Polymer Electroluminescence with Single Wall Carbon Nanotubes," *Nano Letters,* 11(3): 966-972 (2011); Qiao et al., "Controlling charge balance and exciton recombination by bipolar host in single-layer organic light-emitting diodes," *Journal of Applied Physics,* 108(3): 034508/1-034508/8 (2011); Khizar-ul-Haq et al., "Blue organic light-emitting diodes with low driving voltage and enhanced power efficiency based on $MoO_3$ as hole injection layer and optimized charge balance," *Journal of Non-Crystalline Solids,* 356(20-22): 1012-1015 (2010); Qi et al., "Analysis of metal-oxide-based charge generation layers used in stacked organic light-emitting diodes," *Journal of Applied Physics,* 107(1): 014514/1-014514/8 (201); Huang et al., "Materials and interface engineering in organic light-emitting diodes," *Organic Electronics,* 243-261 (2010); Helander et al., "Comparison of $Alq_3$/alkali-metal fluoride/Al cathodes for organic electroluminescent devices," *Journal of Applied Physics,* 104(9): 094510/1-094510/6 (2008); Roy Choudhury et al., "LiF as an n-dopant in tris(8-hydroxyquinoline) aluminum thin films," *Advanced Materials,* 20(8): 1456-1461 (2008); Vacca et al., "Poly(3,4-ethylenedioxythiophene):poly(4-styrenesulfonate) ratio: Structural, physical and hole injection properties in organic light emitting diodes," *Thin Solid Films*, 516(12): 4232-4237 (2008); Yang et al., "Improved fabrication process for enhancing light emission in single-layer organic light-emitting devices doped with organic salt," *Japanese Journal of Applied Physics*, 47(2, Pt. 1): 1101-1103 (2008); Kim et al., "UV-ozone surface treatment of indium-tin-oxide in organic light emitting diodes," *Journal of the Korean Physical Society*, 50(6): 1858-1861 (2007); Prat et al., "Stable, highly efficient and temperature resistant organic light-emitting devices," *Japanese Journal of Applied Physics, Part 1: Regular Papers, Brief Communications & Review Papers,"* 46(4A): 1727-1730 (2007); Luo et al., "Improving the stability of organic light-emitting devices by using a hole-injection-tunable-anode-buffer-layer," *Journal of Applied Physics*, 101(5): 054512/1-054512/4 (2007); Matsushima et al., "Charge-carrier injection characteristics at organic/organic heterojunction interfaces in organic light-emitting diodes," *Chemical Physics Letters*, 435(4-6): 327-330 (2007); Kim et al., "Controllable work function of Li—Al alloy nanolayers for organic light-emitting devices," *Advanced Engineering Materials*, 7(11): 1023-1027 (2005); Kato, "Designing Interfaces That Function to Facilitate Charge Injection in Organic Light-Emitting Diodes," *Journal of the American Chemical Society*, 127(33): 11538-11539 (2005); Veinot et al., "Toward the Ideal Organic Light-Emitting Diode. The Versatility and Utility of Interfacial Tailoring by Cross-Linked Siloxane Interlayers," *Accounts of Chemical Research*, 38(8): 632-643 (2005); Oyamada et al., "Extremely low-voltage driving of organic light-emitting diodes with a Cs-doped phenyldipyrenylphosphine oxide layer as an electron-injection layer," *Applied Physics Letters*, 86(3): 033503/1-033503/3 (2005); Hughes et al., "Electron-transporting materials for organic electroluminescent and electrophosphorescent devices," *Journal of Materials Chemistry*, 15(1): 94-107 (2005); D'Andrade et al., "Efficient organic electrophosphorescent white-light-emitting device with a triple doped emissive layer," *Advanced Materials*, 16(7): 624-628 (2004); Kanno et al., "Development of OLED with high stability and luminance efficiency by co-doping methods for full color displays," *IEEE Journal of Selected Topics in Quantum Electronics*, 10(1): 30-36 (2004); Han et al., "Transparent-cathode for top-emission organic light-emitting diodes," *Applied Physics Letters*, 82(16): 2715-2717 (2003); Tutis et al., "Internal electric field and charge distribution in multilayer organic light-emitting diodes," *Journal of Applied Physics*, 93(8): 4594-4602 (2003); Mathai et al., "Controlled injection of holes into AlQ3 based OLEDs by means of an oxidized transport layer," *Materials Research Society Symposium Proceedings*, 708(Organic Optoelectronic Materials, Processing and Devices): 101-106 (2002); Crone et al., "Charge injection and transport in single-layer organic light-emitting diodes," *Applied Physics Letters*, 73(21): 3162-3164 (1998); and Park et al., "Charge injection and photooxidation of single conjugated polymer molecules," *Journal of the American Chemical Society*, 126(13): 4116-7 (2004).

OLETs according to the present teachings can be fabricated on various substrates including plastic, flexible substrates that have a low temperature resistance. Examples of such flexible substrates include polyesters such as polyethylene terephthalate, polyethylene naphthalate, polycarbonate; polyolefins such as polypropylene, polyvinyl chloride, and polystyrene; polyphenylene sulfides such as polyphenylene sulfide; polyamides; aromatic polyamides; polyether ketones; polyimides; acrylic resins; polymethylmethacrylate, and blends and/or copolymers thereof. In some embodiments, the substrate can be a rigid transparent substrate such as glass, quartz and VYCOR®. Substrate-gate materials commonly used in thin-film transistors also can be used. Examples include doped silicon wafer, tin-doped indium oxide (ITO) on glass, tin-doped indium oxide on polyimide or mylar film, aluminum or other metals alone or coated on a polymer such as polyethylene terephthalate, a doped polythiophene, and the like.

The thicknesses of the various layers may be adapted to optimize performances and/or scaling-down of the OLETs according to the present teachings. In this regard, it may be preferable to have the thickness of the layer of p-type semiconductor material to be between 5 nm and 50 nm, preferably between 15 nm and 45 nm; the thickness of the layer of n-type semiconductor material to be between 30 nm and 60 nm; and the thickness of the layer of emissive material to be between 30 nm and 60 nm.

A plurality of OLETs can be arranged in a matrix to provide a display device. The display device can include optional driving and switching elements, compensating transistor elements, capacitors, and/or light-emitting diodes. Particularly, such optional driving and switching elements and compensating transistor elements can be organic field-effect transistors.

The following examples are provided to illustrate further and to facilitate understanding of the present teachings and are not in any way intended to limit the invention.

Acronyms are used in the examples to represent certain chemical compounds. Table 1 below provides the IUPAC names and the acronyms of such compounds.

TABLE 1

| | |
|---|---|
| C8-BTBT | 2,7-dioctyl[1]benzo-thieno[3,2-b][1]benzothiophene |
| C5-BTBT | 2,7-dipentyl[1]benzo-thieno[3,2-b][1]benzothiophene |
| DNTT | dinaphtho[2,3-b:2',3'-f]thieno[3,2-b]thiophene |
| DH4T | 5,5'-bis(3-hexyl-2-thienyl)-2,2'-bithiophene |
| N-F2-6 | 2,5-bis(4-(perfluorooctyl)phenyl)thieno[3,2-b]thiophene |
| N-F2-6-CF3 | 2,5-bis(4-(trifluoromethyl)phenyl)thieno[3,2-b]thiophene |
| N-F4-1 | 2,6-bis(4-heptadecafluorooctylphenyl)-dithieno[3,2-b:2',3'-d]thiophene |
| DFH4T | 5,5'-bis((5-perfluorohexyl)thiophen-2-yl)-2,2'-bithiophene |
| TCTA | 4,4',4''-tris(carbazole-9-yl)triphenylamine |
| NP4-CBP | 4,4'-bis(3,6-dineopentyl-9H-carbazole-9-yl)-1,'-biphenyl |
| Ir(piq)$_3$ | tris(1-phenylisoquinoline)iridium(III) |
| Ir(ppy)$_3$ | tris(2-phenylpyridine)iridium(III) |
| FIrpic | bis(4,6-difluorophenyl-pyridine)(picolinate)iridium(III) |
| PtOEP | 2,3,7,8,12,13,17,18-octaethylporphyrin-22,24-diide; platinum(2+) |
| Alq$_3$ | tris(8-hydroxyquinolinato)aluminium |
| DCM | 4-(dicyanomethylene)-2-methyl-6-(4-dimethylaminostyryl)-4H-pyran |

Example 1

With reference to FIG. 1, an organic ambipolar light-emitting transistor (OLET) according to the present teachings was fabricated on a glass substrate (first layer 1), onto which a transparent control electrode 2 made of ITO (indium tin oxide) was provided. A 450 nm-thick dielectric layer 3 composed of poly(methyl methacrylate) (PMMA) was fabricated on the ITO electrode by spin-coating and cured in vacuum at 90° C. An organic emissive ambipolar channel was formed on the dielectric layer by sublimation in vacuum ($10^{-7}$ mbar) and includes the following layers:

- a hole transport layer 4 composed of a p-type semiconductor material deposited over the dielectric layer 3, specifically, a 15 nm-thick film made of C8-BTBT sublimated at a rate of 0.1 Å/s, while the substrate was maintained at room temperature;
- an emissive layer 5 in contact with the hole transport layer 4, specifically, a 60 nm-thick recombination layer composed of a host-guest system (with a guest emitter concentration of 20%). TCTA was used as the host matrix and it was sublimated at a rate of 1 Å/s, while the substrate was maintained at room temperature. Ir(piq)$_3$ was used as the guest emitter and it was sublimated at a rate of 0.25 Å/s, while the substrate was maintained at room temperature; and
- an electron transport layer 6 in contact with the emissive layer 5, specifically, a 45 nm-thick film of N-F2-6 sublimated at a rate of 0.1 Å/s, while the substrate was maintained at room temperature.

The metal source and drain electrodes 7 and 7', made of silver (Ag), were deposited in vacuum ($10^{-6}$ mbar) and each has a thickness of 70 nm.

The device channel length (L) and channel width (W) are 70 μm and 12 mm, respectively.

The OLET described above was found to have the following characteristic parameters:
p-type threshold voltage=−40.1 V;
p-type mobility=$5.2 \times 10^{-1}$ cm$^2$/Vs;
n-type threshold voltage=38.4 V;
n-type mobility=$3.6 \times 10^{-3}$ cm$^2$/Vs.

Figure 2:
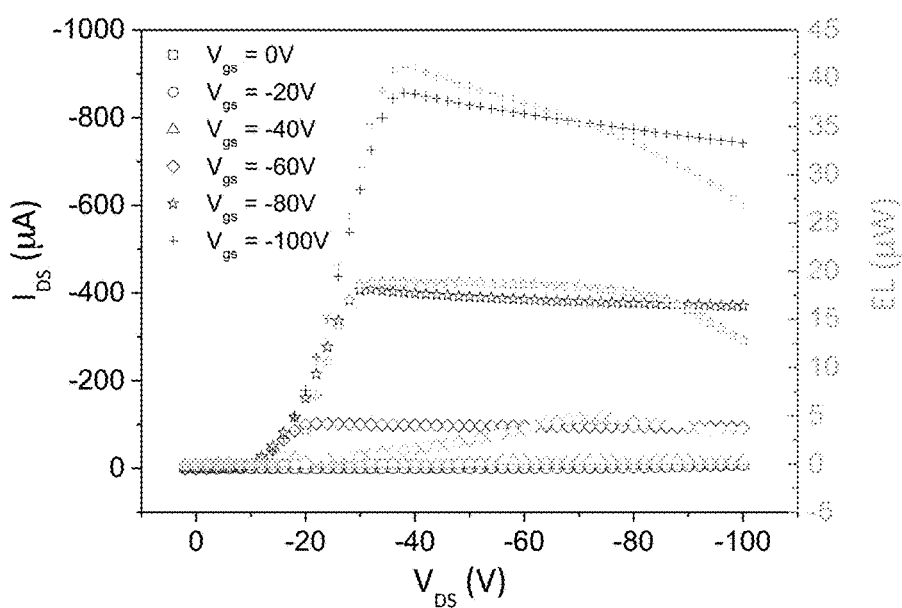
FIG. 2 plots drain-source current $I_{DS}$ (left scale—black curves) and electroluminescence optical output power EL (right scale—gray curves) as a function of the drain-source voltage $V_{DS}$ at different values of the gate-source voltage $V_{GS}$, as obtained from a first exemplary OLET having the architecture shown in FIG. 1 and incorporating an electron-transporting compound represented by formula I as the n-type semiconductor material.
Figure 3:
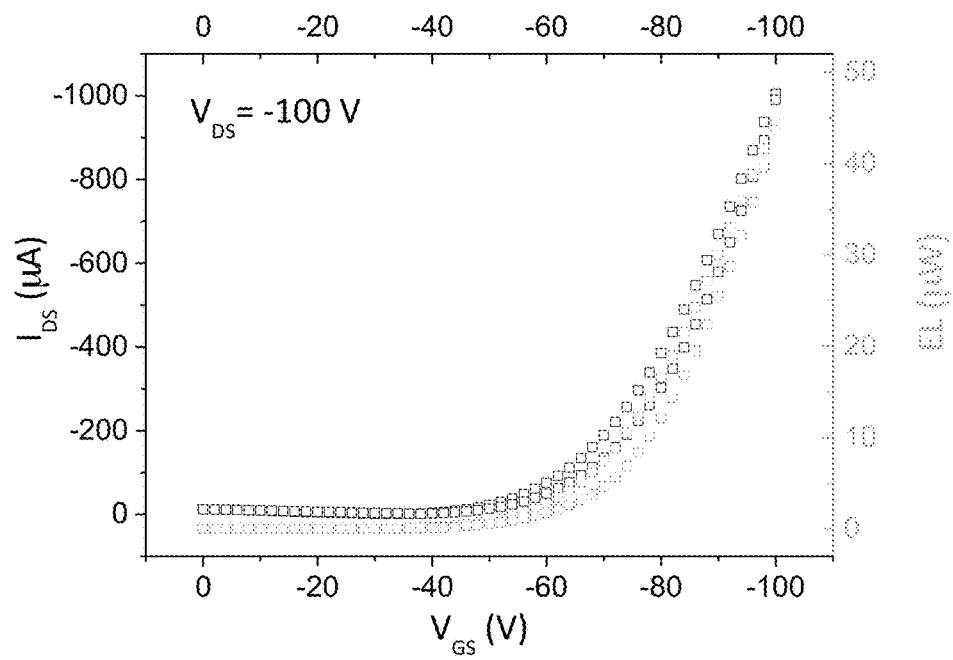
FIG. 3 plots drain-source current $I_{DS}$ (left scale—black curve) and electroluminescence optical output power EL (right scale—gray curve) as a function of the gate-source voltage $V_{GS}$ while the drain contact was maintained at a constant bias voltage of −100V and the source contact was grounded ($V_{DS}$=−100V), as obtained from the first exemplary OLET.

Current-voltage graphs of the tested OLET are shown in FIG. 2 and FIG. 3. FIG. 2 illustrates variations of the drain-source current ($I_{DS}$) (left scale—black curves) and the electroluminescence optical output power (EL) (right scale—gray curves) as a function of the drain-source voltage ($V_{DS}$) at different gate-source voltages ($V_{GS}$), while the source contact was grounded. FIG. 3 illustrates variations of the drain-source current ($I_{DS}$) (left scale—black curve) and of the electroluminescence optical output power (EL) (right scale—gray curve) as a function of the gate-source voltage ($V_{GS}$) while the drain contact was maintained at a constant bias voltage of −100V and the source contact was grounded ($V_{DS}$=−100V).

Figure 4:
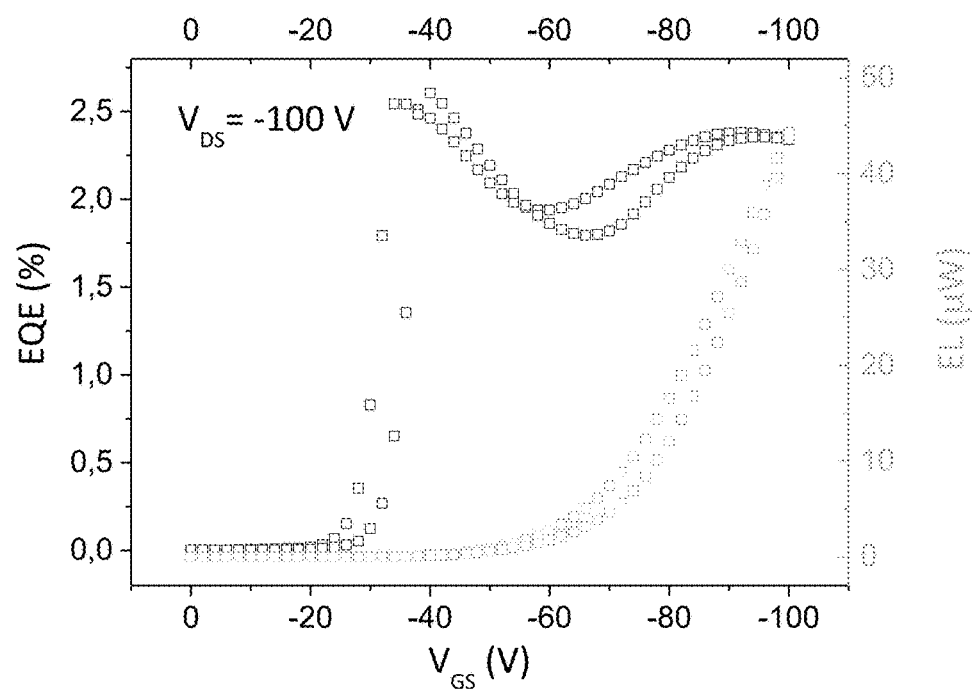
FIG. 4 plots external quantum efficiency EQE (left scale—black curves) and electroluminescence optical output power EL (right scale—gray curves) as a function of the gate-source voltage $V_{GS}$ while the drain contact was maintained at a constant bias voltage of −100V and the source contact was grounded ($V_{DS}$=−100V), as obtained from the first exemplary OLET.

FIG. 4 shows graphs of the external quantum efficiency (EQE, left scale—black curve) and of the electroluminescence optical output power EL (right scale—gray curves) as a function of the gate-source voltage $V_{GS}$ while the drain contact was maintained at a constant bias voltage of −100V and the source contact was grounded ($V_{DS}$=−100V).

As shown in FIG. 4, the tested OLET which has a layer of n-type semiconductor material composed of an electron-transporting compound represented by formula (N-1) (in this case, N-F2-6) unexpectedly achieved high brightness (EL 45 μW) and efficiency (EQE~2.25%) simultaneously.

Example 2

A second OLET was fabricated in the same manner and using the same materials (including using N-F2-6 as the material for the electron transport layer 6) as the OLET described in Example 1, with the exception that the hole transport layer 4 of p-type semiconductor material was a layer of 15 nm-thick film made of C5-BTBT instead of C8-BTBT.

The resulting OLET showed the following characteristic parameters:
p-type threshold voltage=−54.5 V;
p-type-mobility=$1.2 \times 10^{-1}$ cm$^2$/Vs;
n-type threshold voltage=25.9 V;
n-type mobility=$4.2 \times 10^{-3}$ cm$^2$/Vs.

Figure 5:
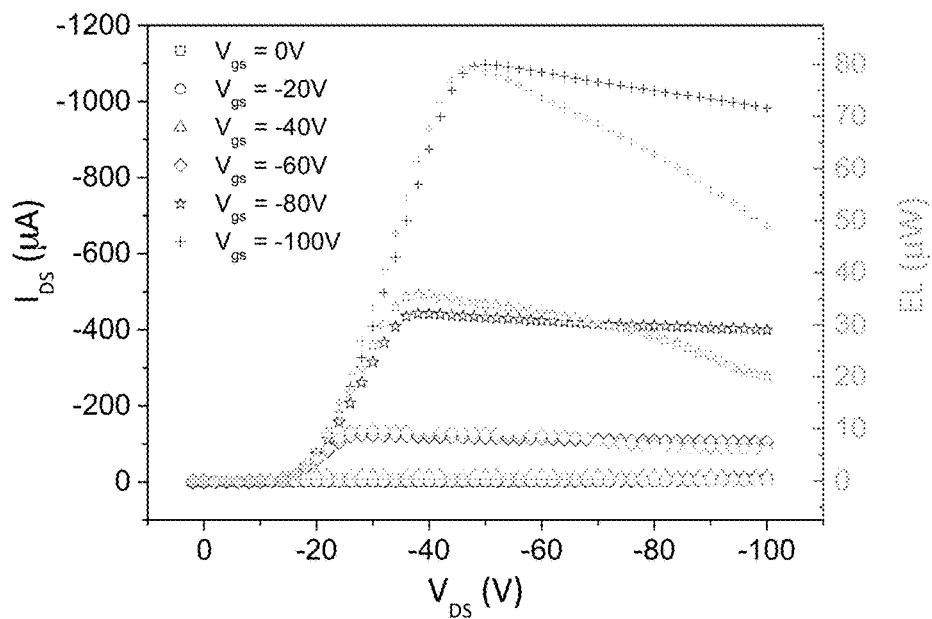
FIG. 5 plots drain-source current $I_{DS}$ (left scale—black curves) and electroluminescence optical output power EL (right scale—gray curves) as a function of the drain-source voltage $V_{DS}$ at different values of the gate-source voltage $V_{GS}$, as obtained from a second exemplary OLET having the architecture shown in FIG. 1 and incorporating an electron-transporting compound represented by formula I as the n-type semiconductor material.
Figure 6:
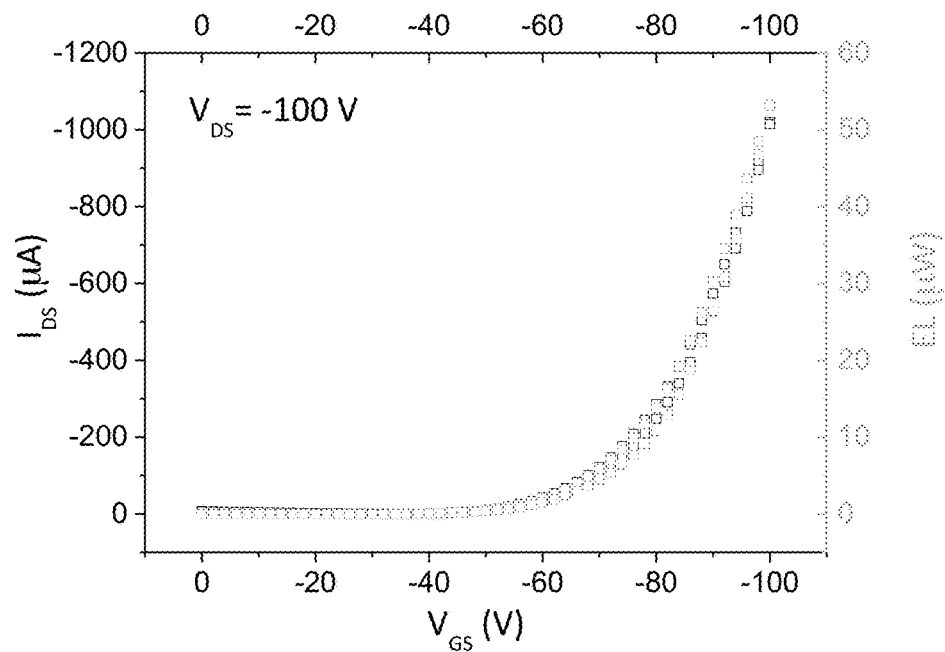
FIG. 6 plots drain-source current $I_{DS}$ (left scale—black curve) and electroluminescence optical output power EL (right scale—gray curve) as a function of the gate-source voltage $V_{GS}$ while the drain contact was maintained at a constant bias voltage of −100V and the source contact was grounded ($V_{DS}$=−100V), as obtained from the second exemplary OLET.

Current-voltage graphs of the tested OLET are shown in FIG. 5 and FIG. 6. FIG. 5 illustrates variations of the drain-source current ($I_{DS}$) (left scale—black curves) and the electroluminescence optical output power (EL) (right scale—gray curves) as a function of the drain-source voltage ($V_{DS}$) at different gate-source voltage ($V_{GS}$), while the source contact was grounded. FIG. 6 illustrates variations of the drain-source current ($I_{DS}$) (left scale—black curve) and of the electroluminescence optical output power (EL) (right scale—gray curve) as a function of the gate-source voltage ($V_{GS}$) while the drain contact was maintained at a constant bias voltage of −100V and the source contact was grounded ($V_{DS}$=−100V).

Figure 7:
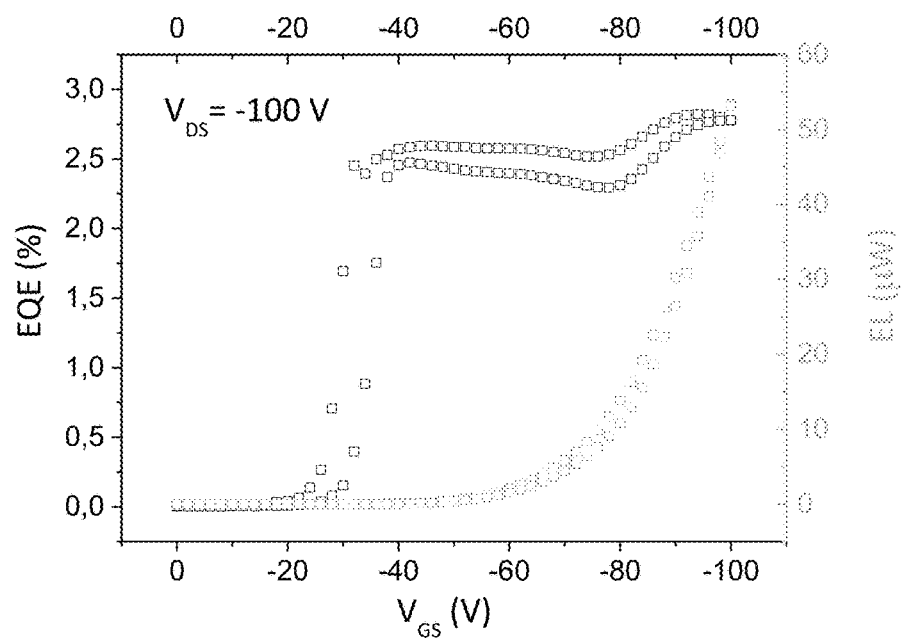
FIG. 7 plots external quantum efficiency EQE (left scale—black curves) and electroluminescence output power EL (right scale—gray curves) as a function of the gate-source voltage $V_{GS}$ while the drain contact was maintained at a constant bias voltage of −100V and the source contact was grounded ($V_{DS}$=−100V), as obtained from the second exemplary OLET.

FIG. 7 shows graphs of the external quantum efficiency (EQE, left scale—black curve) and of the electroluminescence optical output power EL (right scale—gray curves) as a function of the gate-source voltage $V_{GS}$ while the drain contact was maintained at a constant bias voltage of −100V and the source contact was grounded ($V_{DS}$=−100V).

As shown in FIG. 7, the tested OLET which has a layer of n-type semiconductor material composed of an electron-transporting compound represented by formula (N-1) (in this case, N-F2-6) unexpectedly achieved high brightness (EL>50 μW) and efficiency (EQE>2.5%) simultaneously.

Example 3

A third OLET was fabricated in the same manner and using the same materials (including using N-F2-6 as the material for the electron transport layer 6) as the OLET described in Example 1, with the exception that the hole transport layer 4 of p-type semiconductor material was a layer of 15 nm-thick film made of DNTT instead of C8-BTBT.

The resulting transistor showed the following characteristic parameters:
p-type threshold voltage=−40 V;
p-type-mobility=$5 \times 10^{-5}$ cm$^2$/Vs;
n-type threshold voltage=34 V;
n-type mobility=0.5 cm$^2$/Vs.

Figure 8:
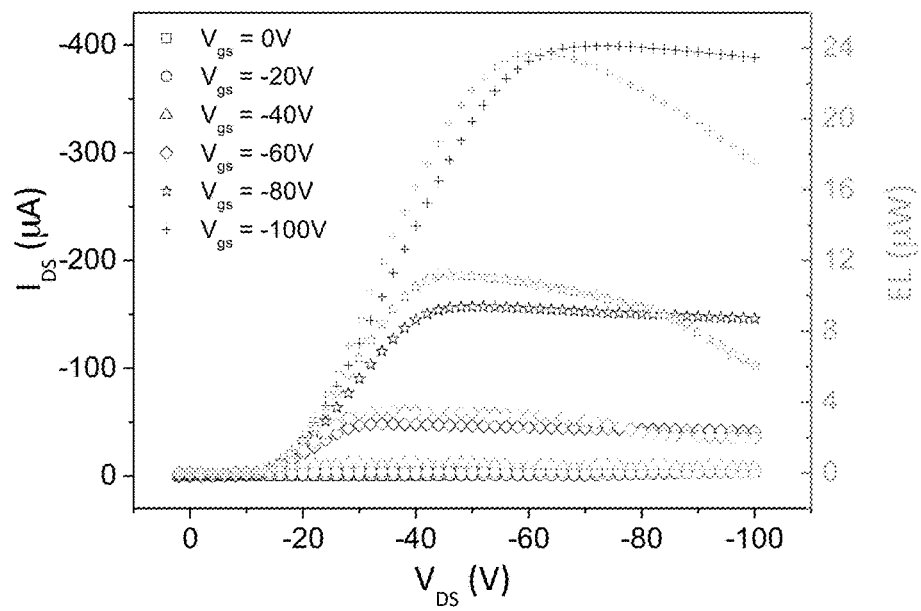
FIG. 8 plots drain-source current $I_{DS}$ (left scale—black curves) and electroluminescence optical output power EL (right scale—gray curves) as a function of the drain-source voltage $V_{DS}$ at different values of the gate-source voltage $V_{GS}$, as obtained from a third exemplary OLET having the architecture shown in FIG. 1 and incorporating an electron-transporting compound represented by formula I as the n-type semiconductor material.
Figure 9:
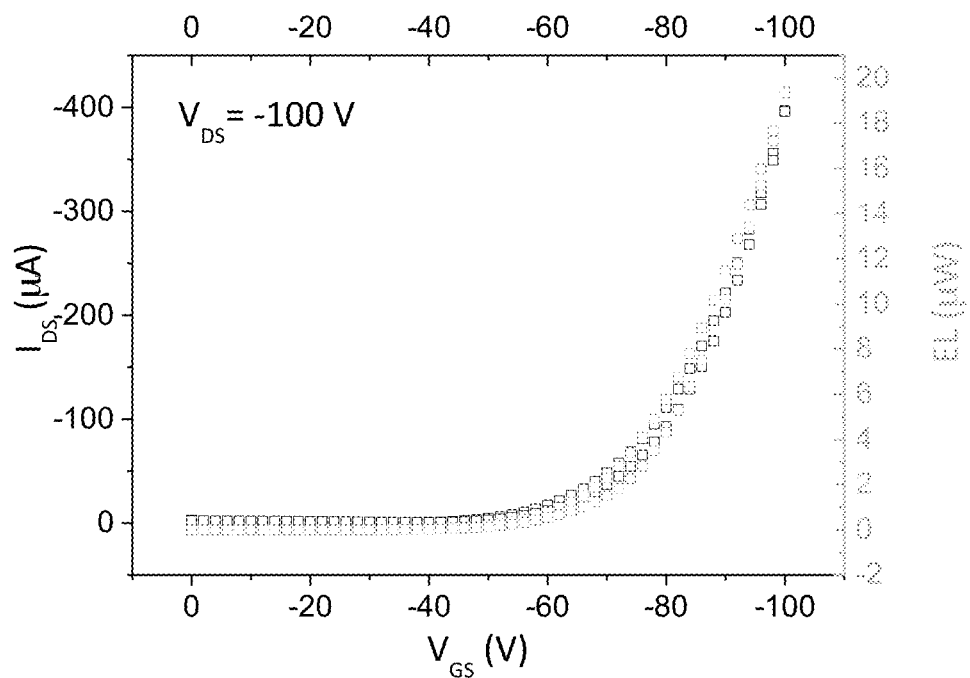
FIG. 9 plots drain-source current $I_{DS}$ (left scale—black curve) and electroluminescence optical output power EL (right scale—gray curve) as a function of the gate-source voltage $V_{GS}$ while the drain contact was maintained at a constant bias voltage of −100V and the source contact was grounded ($V_{DS}$=−100V), as obtained from the third exemplary OLET.

Current-voltage graphs of the tested OLET are shown in FIGS. 8 and 9. FIG. 8 illustrates variations of the drain-source current ($I_{DS}$) (left scale—black curves) and the electroluminescence optical output power (EL) (right scale—gray curves) as a function of the drain-source voltage ($V_{DS}$) at different gate-source voltage ($V_{GS}$), while the source contact was grounded. FIG. 9 illustrates variations of the drain-source current ($I_{DS}$) (left scale—black curve) and of the electroluminescence optical output power (EL) (right scale—gray curve) as a function of the gate-source voltage ($V_{GS}$) while the drain contact was maintained at a constant bias voltage of −100V and the source contact was grounded ($V_{DS}$=−100V).

Figure 10:
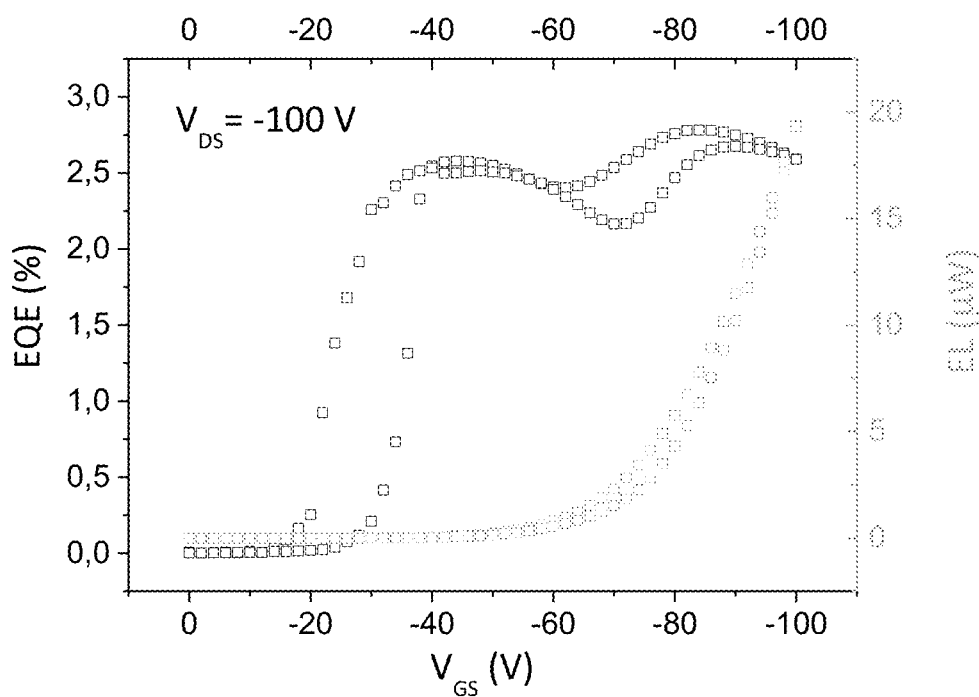
FIG. 10 plots external quantum efficiency EQE (left scale—black curves) and electroluminescence optical output power EL (right scale—gray curves) as a function of the gate-source voltage $V_{GS}$ while the drain contact was maintained at a constant bias voltage of −100V and the source contact was grounded ($V_{DS}$=−100V), as obtained from the third exemplary OLET.

FIG. 10 shows graphs of the external quantum efficiency (EQE, left scale—black curve) and of the electroluminescence optical output power EL (right scale—gray curves) as a function of the gate-source voltage $V_{GS}$ while the drain contact was maintained at a constant bias voltage of −100V and the source contact was grounded ($V_{DS}$=−100V).

As shown in FIG. 10, the tested OLET which has a layer of n-type semiconductor material composed of an electron-transporting compound represented by formula (N-1) (in this case, N-F2-6) unexpectedly achieved high brightness (EL 20 µW) and efficiency (EQE~2.5%) simultaneously, although the electroluminescence achieved by using a p-type semiconductor material composed of DNTT is not as high as using BTBT compounds.

In contrast to the data obtained in Examples 1-3, OLETs having an electron transport layer composed of n-type semiconductor compounds not within formula I were found to have both significantly lower light emission brightness and efficiency. These comparative devices are described in Examples 4 and 5.

Example 4 (Comparative)

The comparative device tested in this example incorporated the p-type semiconductor material (DH4T), the n-type semiconductor material (DFH4T, a bis(fluoroalkyl-substituted) oligothiophene), and the emissive material (Alq$_3$: DCM) used in the organic light-emitting transistor reported in R. Capelli et al., "Organic light-emitting transistors with an efficiency that outperforms the equivalent light-emitting diodes," *Nature Materials*, vol. 9, pp. 496-503 (2010).

Referring again to FIG. 1, a comparative OLET was fabricated on a glass substrate (first layer 1), onto which a transparent control electrode 2 made of ITO (indium tin oxide) was provided. A 450 nm-thick dielectric layer 3 composed of poly(methyl methacrylate) (PMMA) was fabricated on the ITO electrode by spin-coating and cured in vacuum at 90° C. An organic emissive ambipolar channel was formed on the dielectric layer by sublimation in vacuum ($10^{-7}$ mbar) and includes the following layers:
- an electron transport layer 4 of an n-type semiconductor material deposited over the dielectric layer 3, specifically, a layer of 15 nm-thick film made of DFH4T sublimated at a rate of 0.1 Å/s, while the substrate was maintained at room temperature;
- an emissive layer 5 in contact with the hole transport layer 4, specifically, a 60 nm-thick recombination layer composed of a host-guest system (with a guest emitter concentration of 20%). Alq$_3$ was used as the host matrix and it was sublimated at a rate of 1 Å/s, while the substrate was maintained at room temperature. DCM was used as the guest emitter and it was sublimated at a rate of 0.25 Å/s, while the substrate was maintained at room temperature; and
- a hole transport layer 6 in contact with the emissive layer 5, in this case, a 45 nm-thick film of DH4T sublimated at a rate of 0.1 Å/s, while the substrate was maintained at room temperature.

The metal source and drain electrodes 7 and 7', made of silver (Ag), were deposited in vacuum ($10^{-6}$ mbar) and each has a thickness of 70 nm.

The device channel length (L) and channel width (W) are 70 µm and 12 mm, respectively.

The resulting OLET was found to have the following characteristic parameters:
p-type threshold voltage=−60 V;
p-type mobility=5.3×$10^4$ cm$^2$/Vs;
n-type threshold voltage=23.7 V;
n-type mobility=3.6×$10^{-3}$ cm$^2$/Vs.

Figure 11:
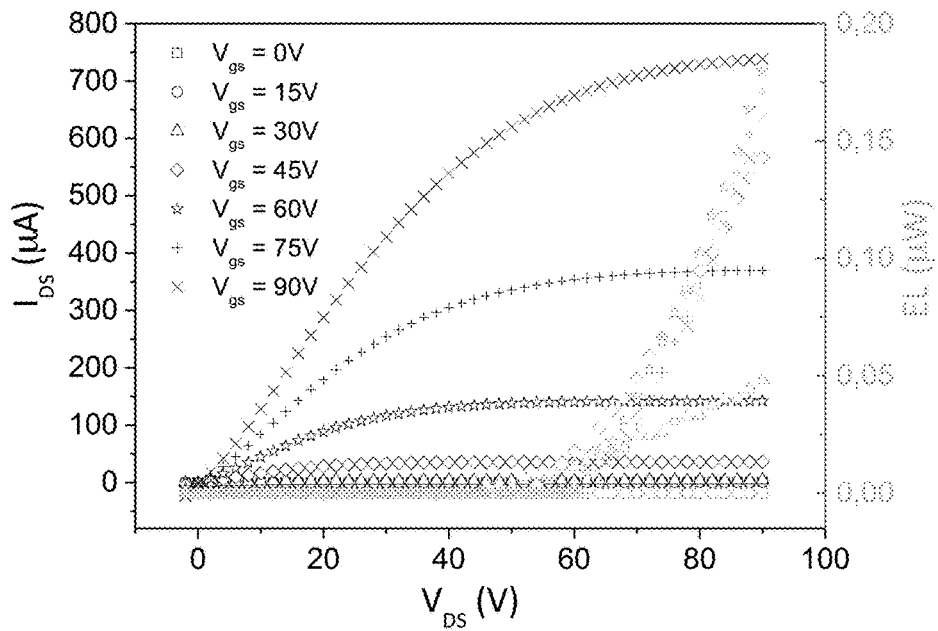
FIG. 11 plots drain-source current $I_{DS}$ (left scale—black curves) and electroluminescence output power EL (right scale—gray curves) as a function of the drain-source voltage $V_{DS}$ at different values of the gate-source voltage $V_{GS}$, as obtained from a first comparative OLET having the architecture shown in FIG. 1 and incorporating a first comparative electron-transporting compound not within formula I as the n-type semiconductor material.
Figure 12:
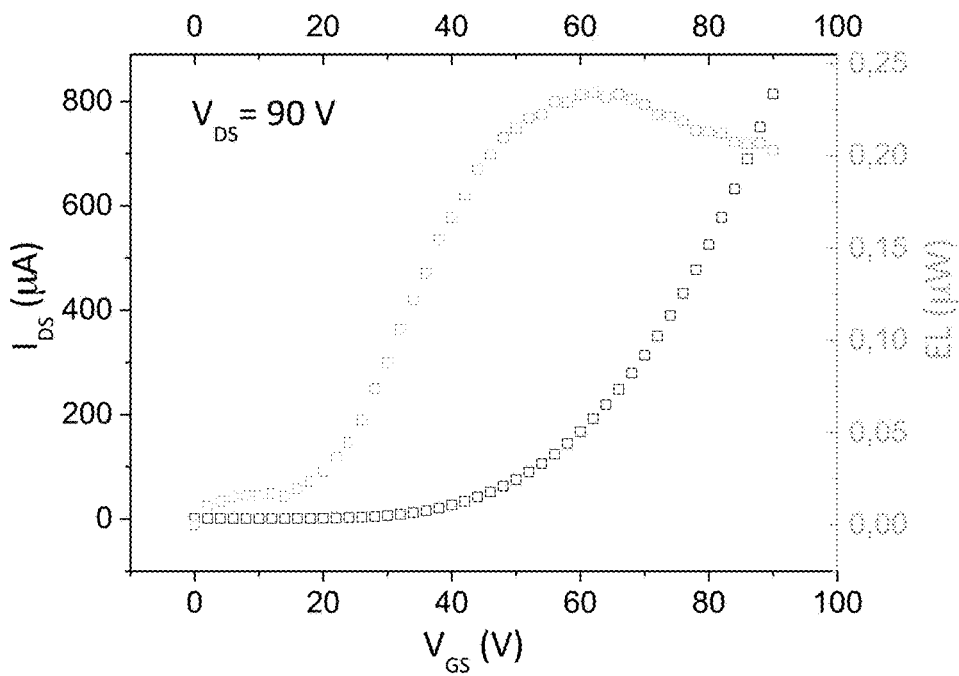
FIG. 12 plots drain-source current $I_{DS}$ (left scale—black curve) and electroluminescence optical output power EL (right scale—gray curve) as a function of the gate-source voltage $V_{GS}$ while the drain contact was maintained at a constant bias voltage of −100V and the source contact was grounded ($V_{DS}$=−100V), as obtained from the first comparative OLET.

Current-voltage graphs of the tested OLET are shown in FIG. 11 and FIG. 12. FIG. 11 illustrates variations of the drain-source current ($I_{DS}$) (left scale—black curves) and the electroluminescence optical output power (EL) (right scale—gray curves) as a function of the drain-source voltage ($V_{DS}$) at different gate-source voltage ($V_{GS}$), while the source contact was grounded. FIG. 12 illustrates variations of the drain-source current ($I_{DS}$) (left scale—black curve) and of the electroluminescence optical output power (EL) (right scale—gray curve) as a function of the gate-source voltage ($V_{GS}$) while the drain contact was maintained at a constant bias voltage of 90V and the source contact was grounded ($V_{DS}$=90V).

Figure 13:
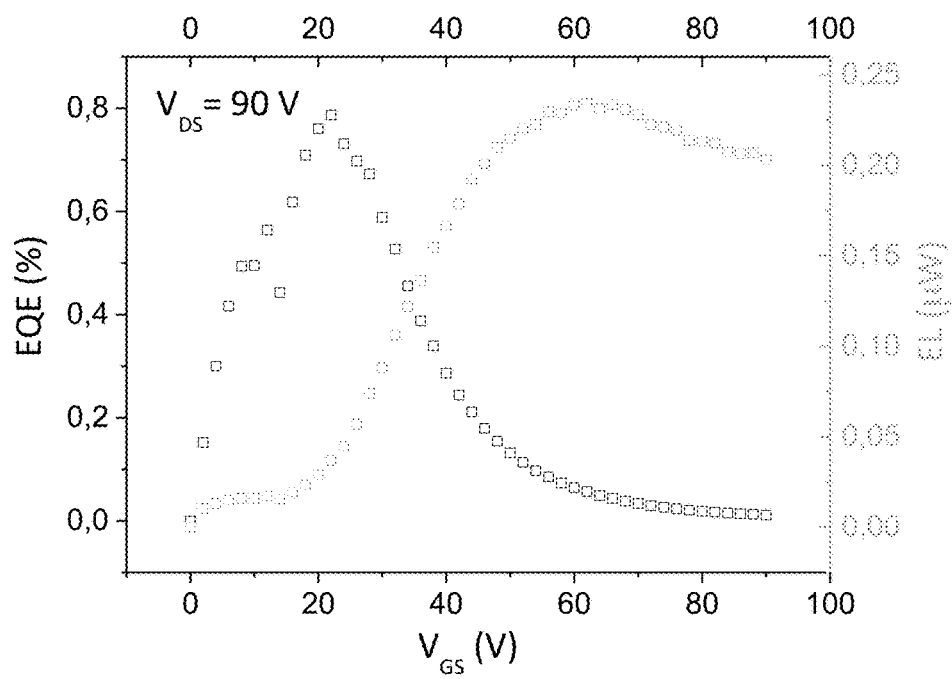
FIG. 13 plots external quantum efficiency EQE (left scale—black curves) and electroluminescence optical output power EL (right scale—gray curves) as a function of the gate-source voltage $V_{GS}$ while the drain contact was maintained at a constant bias voltage of −100V and the source contact was grounded ($V_{DS}$=−100V), as obtained from the first comparative OLET.

FIG. 13 shows graphs of the external quantum efficiency (EQE, left scale—black curve) and of the electroluminescence optical output power EL (right scale—gray curves) as a function of the gate-source voltage $V_{GS}$ while the drain contact was maintained at a constant bias voltage of 90V and the source contact was grounded ($V_{DS}$=90V).

As shown in FIG. 13, the comparative OLET tested in this example, which incorporated a combination of materials previously reported in the art, showed significantly lower brightness (EL<0.25 µW) and efficiency (EQE<0.8%) compared to the devices of Examples 1-3. Further, the maximum brightness was obtained under conditions when the efficiency was very low, and vice versa (as indicated by the inverse relationship of the EQE and EL curves, especially between $V_{GS}$=20 V and $V_{GS}$=60 V).

Example 5 (Comparative)

A second comparative OLET having an emissive ambipolar channel including a layer of p-type semiconductor material composed of DH4T, an emissive layer composed of Alq$_3$:PtOEP, and a layer of n-type semiconductor material composed of N-F4-1 was fabricated. N-F4-1 is structurally similar to the compounds represented by formula (N-1), except that instead of having a bicyclic core as in the compounds represented by formula (N-1), N-F4-1 has a tricyclic (dithieno[3,2-b:2',3'-d]thiophene) core. Previous reports have suggested that dithieno[3,2-b:2',3'-d]thiophene compounds have much higher mobilities than their bicyclic counterparts. See e.g., U.S. Patent Publication No. 2013-0207081.

Specifically, the second comparative OLET was fabricated on a glass substrate (first layer 1), onto which a transparent control electrode 2 made of ITO (indium tin oxide) was provided. A 450 nm-thick dielectric layer 3 composed of poly(methyl methacrylate) (PMMA) was fabricated on the ITO electrode by spin-coating and cured in vacuum at 90° C. An organic emissive ambipolar channel was formed on the dielectric layer by sublimation in vacuum ($10^{-7}$ mbar) and includes the following layers:
- a hole transport layer 4 composed of a p-type semiconductor material deposited over the dielectric layer 3, specifically, a 15 nm-thick film made of DH4T sublimated at a rate of 0.1 Å/s, while the substrate was maintained at room temperature;
- an emissive layer 5 in contact with the hole transport layer 4, specifically, a 60 nm-thick recombination layer composed of a host-guest system (with a guest emitter concentration of 20%). Alq$_3$ was used as the host matrix and it was sublimated at a rate of 1 Å/s, while the substrate was maintained at room temperature. PtOEP was used as the guest emitter and it was sublimated at a rate of 0.25 Å/s, while the substrate was maintained at room temperature; and an electron transport layer 6 in contact with the emissive layer 5, specifically, a 45 nm-thick film of N-F4-1 sublimated at a rate of 0.1 Å/s, while the substrate was maintained at room temperature.

The metal source and drain electrodes 7 and 7', made of silver (Ag), were deposited in vacuum ($10^{-6}$ mbar) and each has a thickness of 70 nm.

The device channel length (L) and channel width (W) are 70 μm and 12 mm, respectively.

The resulting OLET was found to have the following characteristic parameters:

p-type threshold voltage=−55.2 V;
p-type mobility=3.8×$10^{-2}$ cm$^2$/Vs;
n-type threshold voltage=null;
n-type mobility=null.

Figure 14:
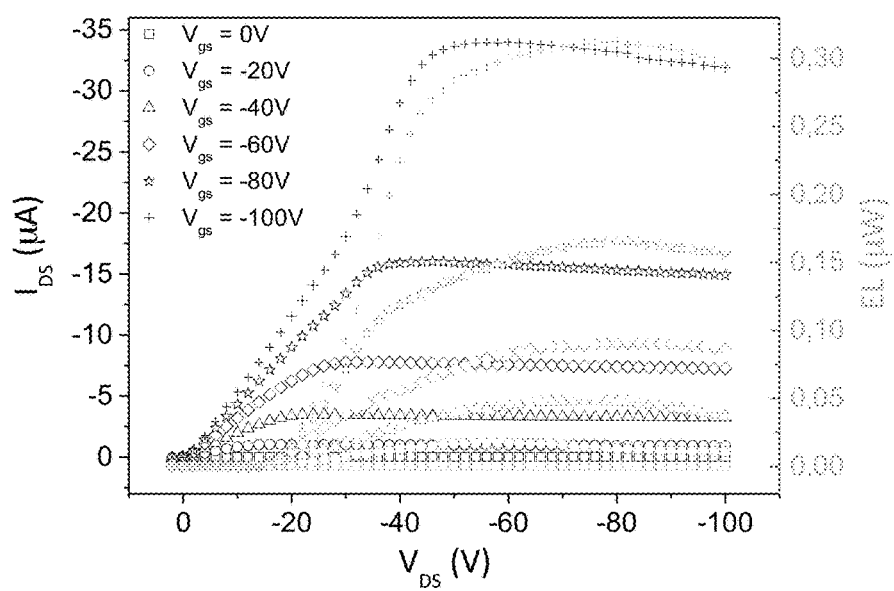
FIG. 14 plots drain-source current $I_{DS}$ (left scale—black curves) and electroluminescence optical output power EL (right scale—gray curves) as a function of the drain-source voltage $V_{DS}$ at different values of the gate-source voltage $V_{GS}$, as obtained from a second comparative OLET having the architecture shown in FIG. 1 and incorporating a second comparative electron-transporting compound not within formula I as the n-type semiconductor material.
Figure 15:
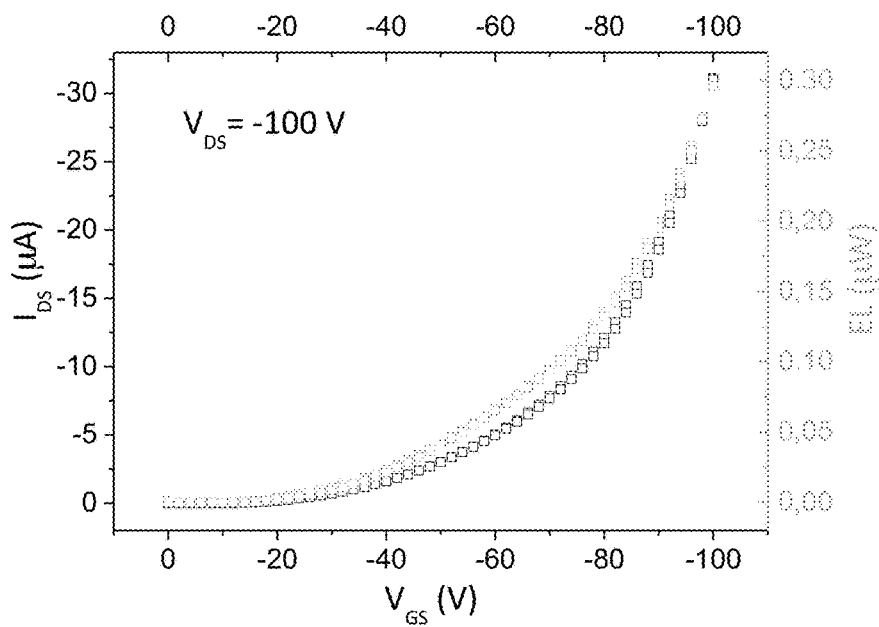
FIG. 15 plots drain-source current $I_{DS}$ (left scale—black curve) and electroluminescence optical output power EL (right scale—gray curve) as a function of the gate-source voltage $V_{GS}$ while the drain contact was maintained at a constant bias voltage of −100V and the source contact was grounded ($V_{DS}$=−100V), as obtained from the second comparative OLET.

Current-voltage graphs of the tested OLET are shown in FIG. 14 and FIG. 15. FIG. 14 illustrates variations of the drain-source current ($I_{DS}$) (left scale—black curves) and the electroluminescence optical output power (EL) (right scale—gray curves) as a function of the drain-source voltage ($V_{DS}$) at different gate-source voltage ($V_{GS}$), while the source contact was grounded. FIG. 15 illustrates variations of the drain-source current ($I_{DS}$) (left scale—black curve) and of the electroluminescence optical output power (EL) (right scale—gray curve) as a function of the gate-source voltage ($V_{GS}$) while the drain contact was maintained at a constant bias voltage of −100V and the source contact was grounded ($V_{DS}$=−100V).

Figure 16:
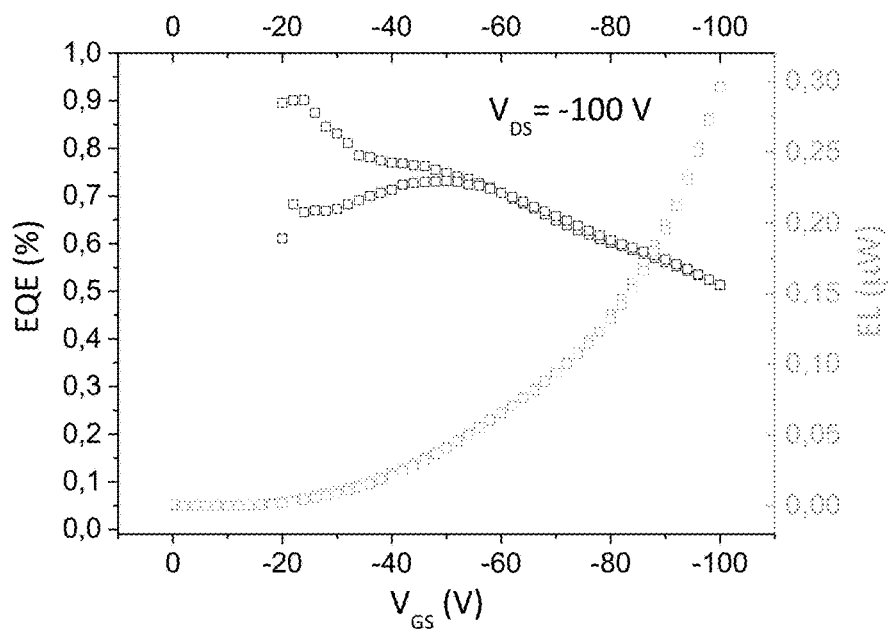
FIG. 16 plots external quantum efficiency EQE (left scale—black curves) and electroluminescence optical output power EL (right scale—gray curves) as a function of the gate-source voltage $V_{GS}$ while the drain contact was maintained at a constant bias voltage of −100V and the source contact was grounded ($V_{DS}$=−100V), as obtained from the second comparative OLET.

FIG. 16 shows graphs of the external quantum efficiency (EQE, left scale—black curve) and of the electroluminescence optical output power EL (right scale—gray curves) as a function of the gate-source voltage $V_{GS}$ while the drain contact was maintained at a constant bias voltage of −100V and the source contact was grounded ($V_{DS}$=−100V).

As shown in FIG. 16, the comparative OLET tested in this example, which incorporated a combination of materials previously reported in the art, showed much lower brightness (EL~0.30 μW) and efficiency (EQE<0.9%) compared to the devices of Examples 1-3. Further, the maximum brightness was obtained under conditions when the efficiency was very low, and vice versa (as indicated by the inverse relationship of the EQE and EL curves). Specifically, when EL was optimized to ~0.30 μW under the condition that $V_{GS}$=−100V, EQE was only ~0.15%. Conversely, when EQE was optimized to ~0.9% under the condition that $V_{GS}$=−20V, EL was only ~0.05 μW. These results are particularly surprising given that dithieno[3,2-b:2',3'-d]thiophene compounds have been reported to have much higher mobilities than their bicyclic counterparts (which can be based upon a thienothiophene core as in certain embodiments of the compounds represented by formula (N-1)).

Examples 1, 2 and 3, therefore, demonstrate that organic electroluminescent transistors which have an organic emissive ambipolar channel that includes an electron transport layer composed of an electron-transporting compound of formula (N-1) in general show a higher source-drain current and a higher optical output power (EL) compared to comparative devices described in Examples 4 and 5, which respectively incorporate alternative n-type semiconductor compounds as the electron transport layer.

Moreover, the organic electroluminescent transistors of Examples 1, 2 and 3 show significantly higher emission quantum efficiencies (EQE) values (see FIGS. 4, 7 and 10, left scale) compared to the comparative devices described in Examples 4 and 5. The EQE values of the transistors of Examples 1, 2 and 3 oscillate around a constant value during gate bias sweep (oscillations within 10-20% of maximum EQE value) providing simultaneous achievement of maximum brightness and efficiency. In Example 4 (FIG. 13, left scale), a substantial deterioration of EQE was observed at increased gate biases (a decrease of about 40% with respect to its maximum value occurred). Analogous deterioration was observed with Example 5.

That the devices demonstrated in Examples 1, 2, and 3 showed such high optical output power and efficiency was made more unexpected by the fact that a polymeric dielectric (PMMA) was used as the dielectric layer, compared to conventional OLETs and OFETs which typically show optimal device performance when an inorganic dielectric such as $SiO_x$ is used as the dielectric layer.

The invention claimed is:

1. An organic electroluminescent transistor comprising: at least one dielectric layer; at least one control electrode; at least one hole electrode; at least one electron electrode; and an assembly comprising an emissive ambipolar channel, wherein:

said dielectric layer is arranged between said control electrode and said assembly;

said emissive ambipolar channel comprises at least one layer of an n-type semiconductor material, at least one layer of a p-type semiconductor material, and at least one layer of an emissive material arranged between said layers of p-type and n-type semiconductor materials;

said n-type semiconductor material comprises an electron-transporting compound represented by formula (N-1):

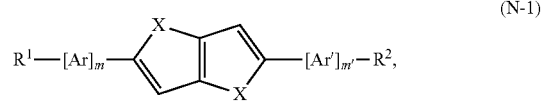

wherein:

X is selected from the group consisting of O, S, and Se;
Ar and Ar', at each occurrence, independently are identical or different monocyclic aryl or heteroaryl groups;
$R^1$ and $R^2$ independently are identical or different electron-withdrawing groups selected from the group consisting of —CN, $R^a$, —C(O)$R^b$, and —C(O)O$R^b$; wherein $R^a$ is a $C_{1-20}$ alkyl, $C_{2-20}$ alkenyl, or $C_{2-20}$ alkynyl group substituted with at least one fluoro or cyano group; and $R^b$ is selected from the group consisting of H, a $C_{1-20}$ alkyl group, a $C_{2-20}$ alkenyl group, and a $C_{2-20}$ alkynyl group, wherein each of the $C_{1-20}$ alkyl group, the $C_{2-20}$ alkenyl group, and the $C_{2-20}$ alkynyl group optionally is substituted with one or more fluoro and/or cyano groups; and
m and m' independently are 1 or 2.

2. The transistor of claim 1, wherein the electron-transporting compound is represented by formula (N-2):

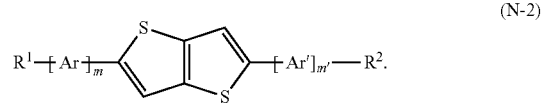

3. The transistor of claim 1, wherein the electron-transporting compound is represented by formula (N-3):

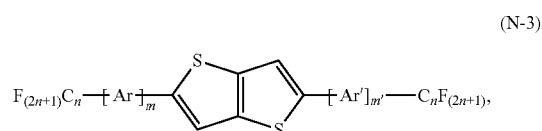

wherein n is an integer ranging from 1 to 12 (inclusive).

4. The transistor of claim 1, wherein Ar and Ar', at each occurrence, independently are selected from the group consisting of a phenyl group, a thienyl group, a thiazolyl group, an isothiazolyl group, a thiadiazolyl group, a furyl group, an oxazolyl group, an isoxazolyl group, an oxadiazolyl group, a pyrrolyl group, a triazolyl group, a tetrazolyl group, a pyrazolyl group, an imidazolyl group, a pyridyl group, a pyrimidyl group, a pyridazinyl group, and a pyrazinyl group.

5. The transistor of claim 4, wherein the electron-transporting compound is represented by formula (N-4):

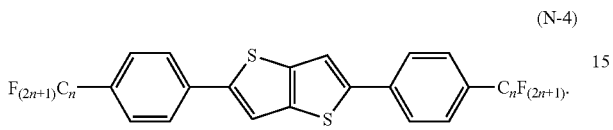

(N-4)

6. The transistor of claim 5, wherein the electron-transporting compound is 2,5-bis(4-(perfluorooctyl)phenyl) thieno[3,2-b]thiophene (N-F2-6):

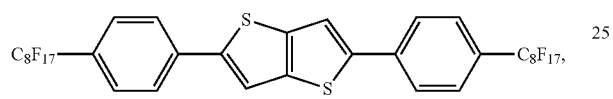

or 2,5-bis(4-(trifluoromethyl)phenyl)thieno[3,2-b]thiophene (N-F2-6-CF3):

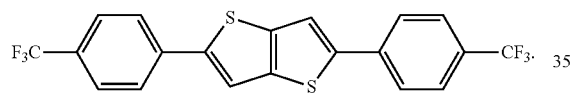

7. The transistor of claim 1, wherein the p-type semiconductor material comprises a hole-transporting compound selected from the group consisting of an oligothiophene, an acene, and a fused heteroarene.

8. The transistor of claim 1, wherein the p-type semiconductor material comprises a hole-transporting compound selected from the group consisting of a dithiophene, a quaterthiophene, a thienothiophene, a benzothiophene, a naphthothiophene, a benzothieno[3,2-b][1]benzothiophene, and a dinaphtho[2,3-b:2',3'-f]thieno[3,2-b]thiophenes, each of which can be optionally α- and/or ω-substituted with a hydrocarbon group.

9. The transistor of claim 1, wherein the p-type semiconductor material comprises a hole-transporting compound represented by formula (P-1), (P-2), (P-3), (P-4), (P-5) or (P-6):

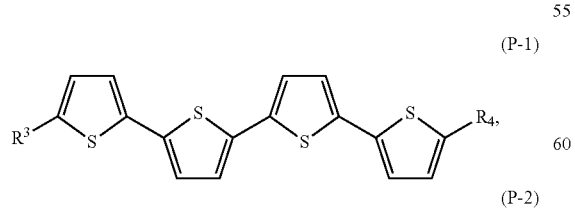

(P-1)

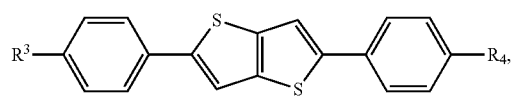

(P-2)

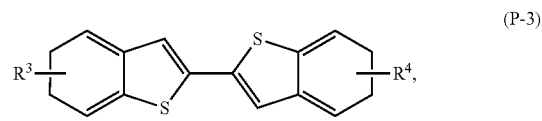

(P-3)

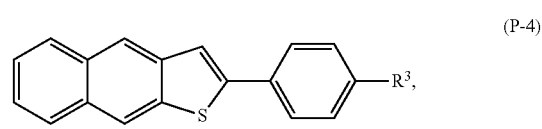

(P-4)

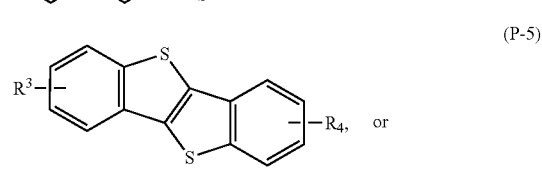

(P-5)

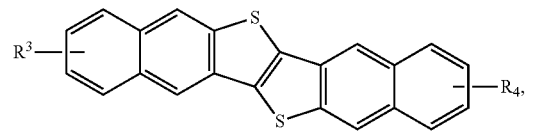

(P-6)

wherein $R^3$ and $R^4$ independently are H or identical or different $C_{1-20}$ alkyl groups.

10. The transistor of claim 9, wherein the p-type semiconductor material comprises a hole-transporting compound selected from the group consisting of:

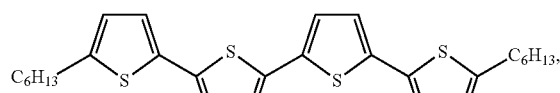

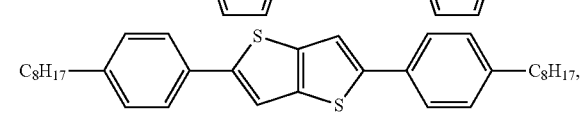

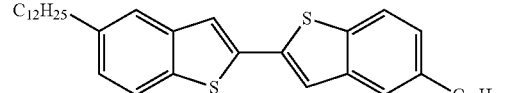

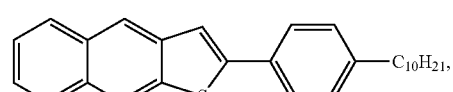

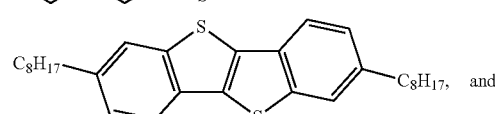

and

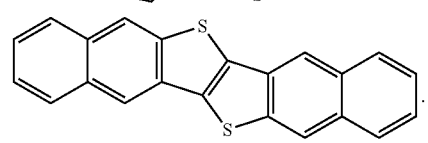

11. The transistor of claim 10, wherein the emissive material is blue-emitting.

12. The transistor of claim 11, wherein the emissive material comprises a blend of the arylamine matrix compound of formula (H-1) and the blue emitter of formula (G-1):

a blend of the arylamine matrix compound of formula (H-2) and the blue emitter of formula (G-1):

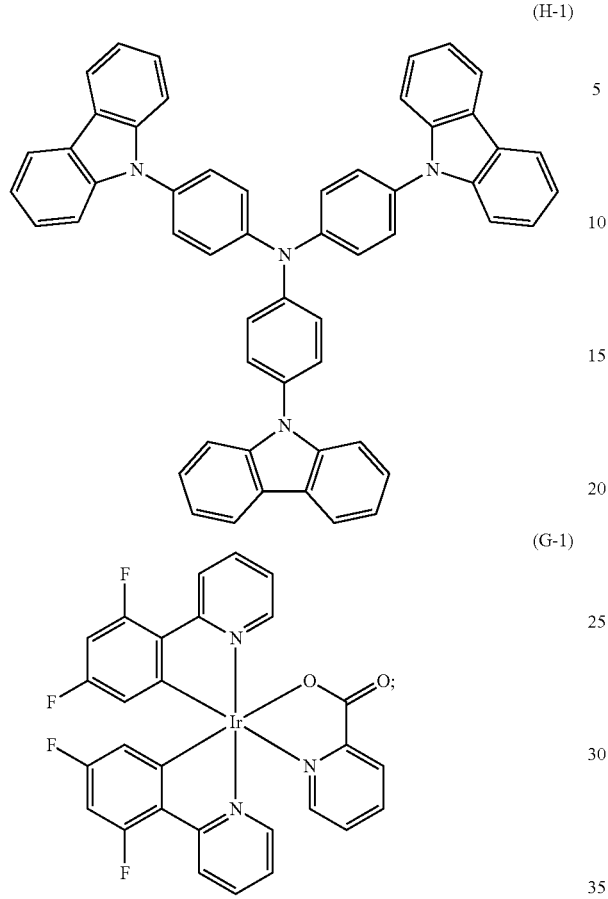

or
a blend of the arylamine matrix compound of formula (H-3) and the blue emitter of formula (G-1):

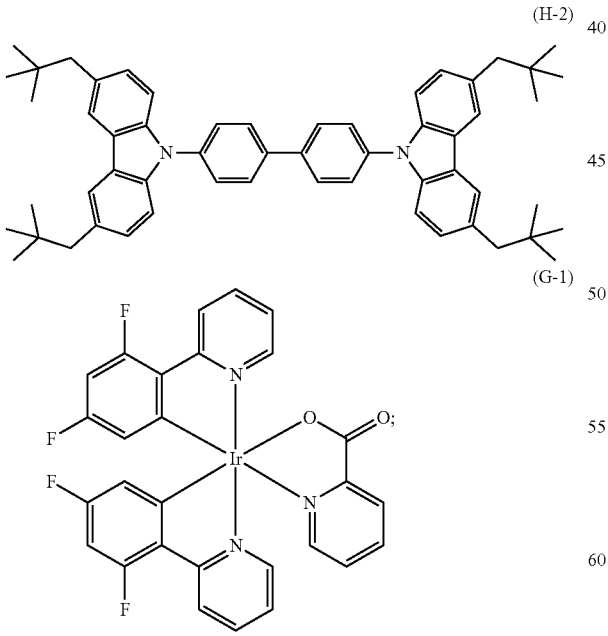

13. The transistor of claim 10, wherein the emissive material is green-emitting.

14. The transistor of claim 13, wherein the emissive material comprises a blend of the arylamine matrix compound of formula (H-1) and the green emitter of formula (G-2):

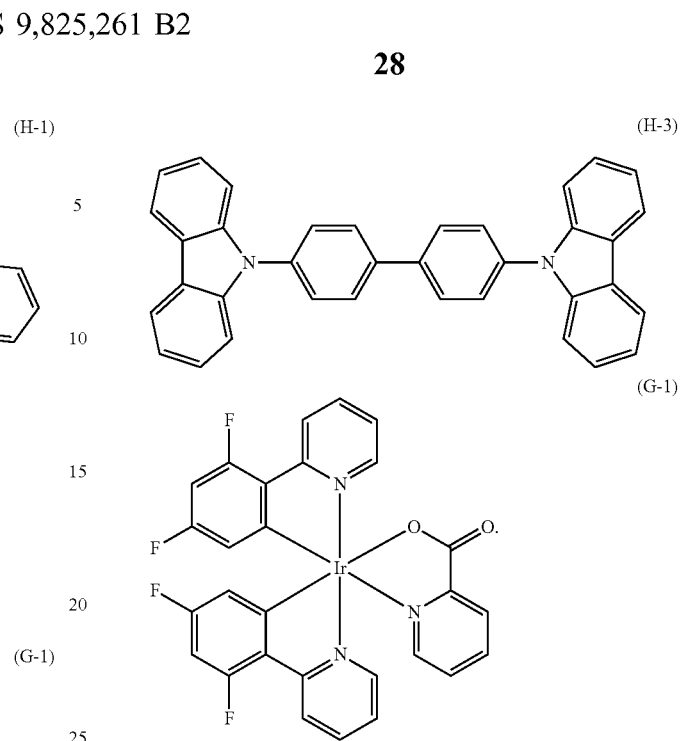

a blend of the arylamine matrix compound of formula (H-2) and the green emitter of formula (G-2):

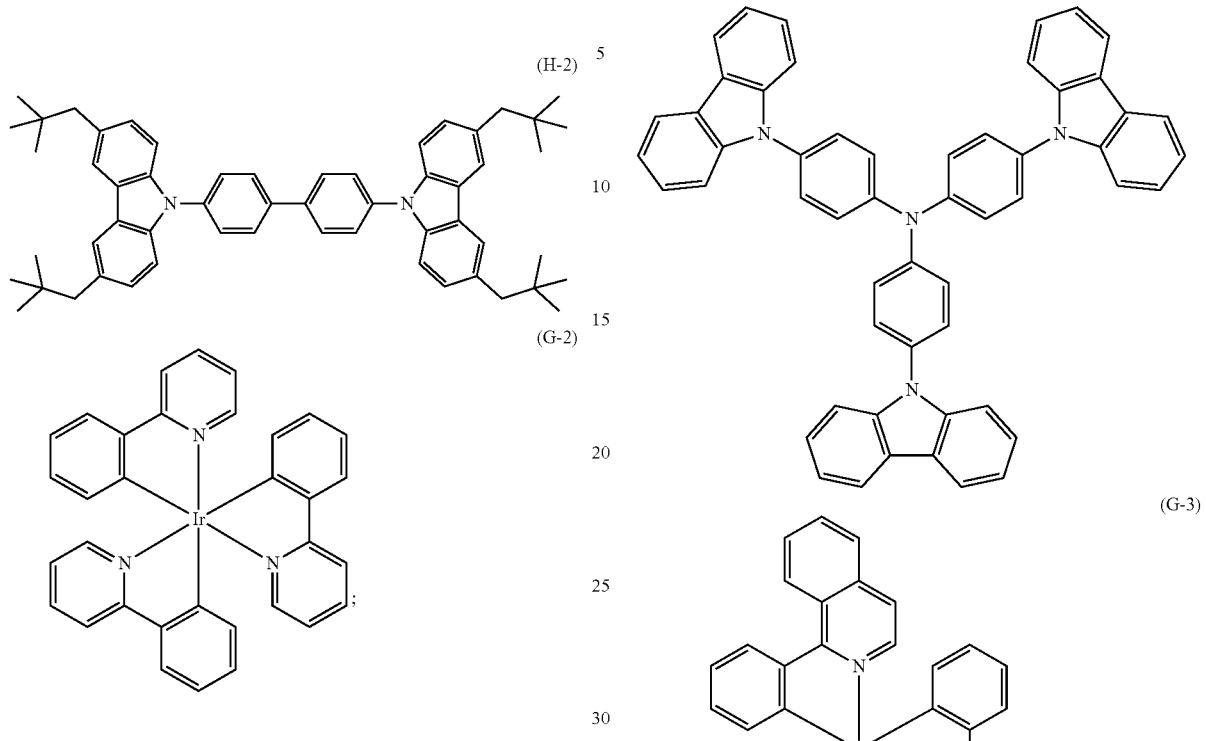

or
a blend of the arylamine matrix compound of formula (H-3) and the green emitter of formula (G-2):

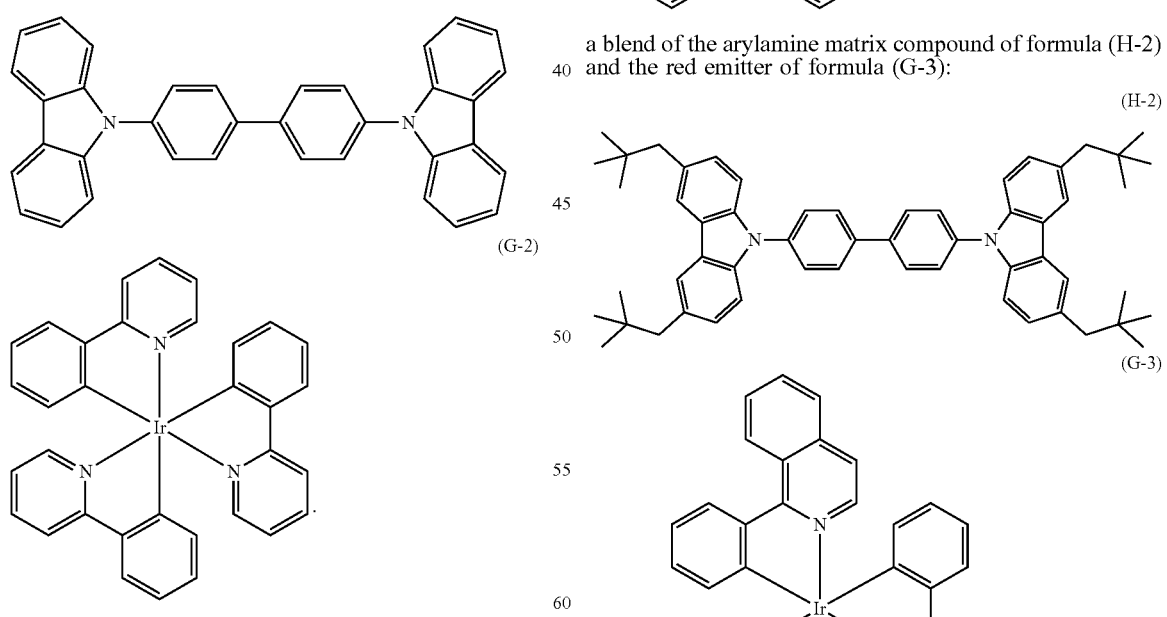

15. The transistor of claim 10, wherein the emissive material is red-emitting.

16. The transistor of claim 15, wherein the emissive material comprises a blend of the arylamine matrix compound of formula (H-1) and the red emitter of formula (G-3):

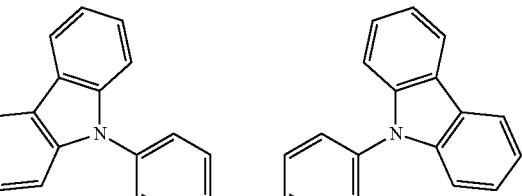

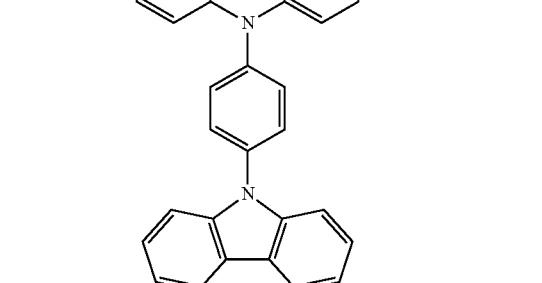

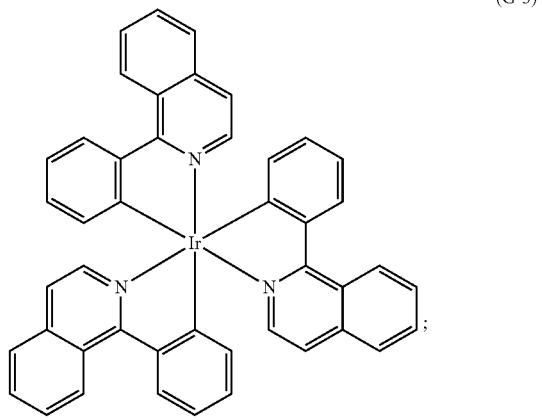

a blend of the arylamine matrix compound of formula (H-2) and the red emitter of formula (G-3):

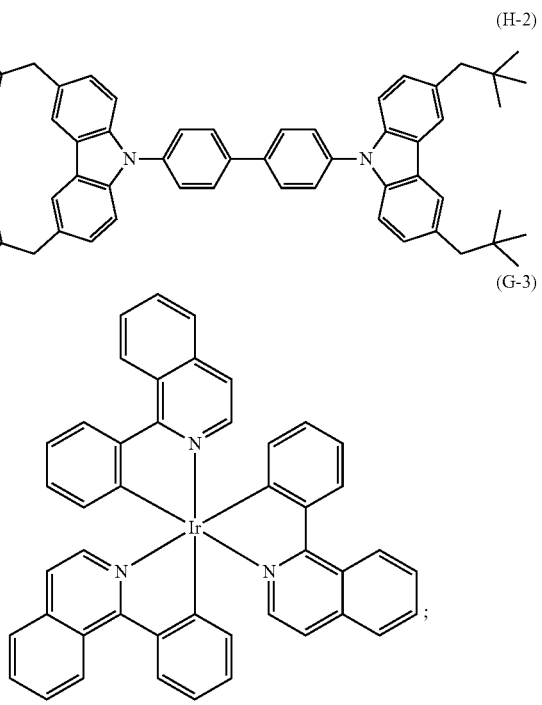

or
a blend of the arylamine matrix compound of formula (H-3) and the red emitter of formula (G-3):

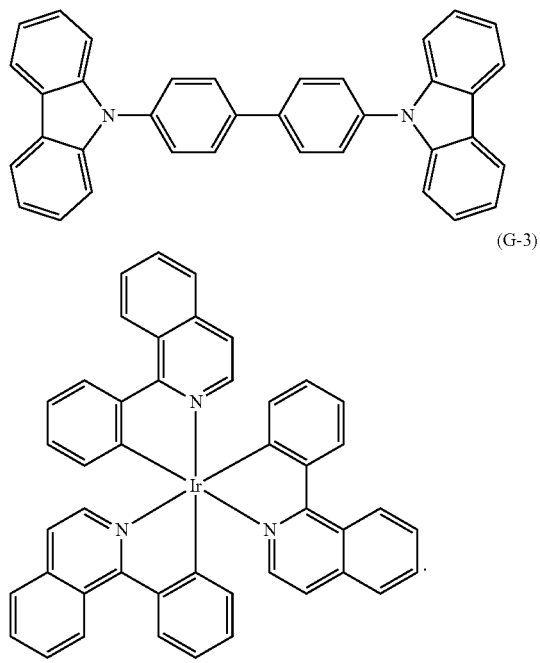

(H-3)

(G-3)

17. The transistor of claim 1, wherein each of the electron electrode, hole electrode, and gate electrode independently comprises a metal or a transparent conducting oxide, wherein optionally, such metal or transparent conducting oxide is selected from the group consisting of gold, silver, molybdenum, copper, titanium, chromium, tin-doped indium oxide and combination thereof, and wherein optionally, the electron electrode and the hole electrode are composed of different metals.

18. The transistor of claim 1, wherein the dielectric layer comprises an electrically insulating material selected from the group consisting of an inorganic oxide or nitride, a molecular dielectric, a polymeric dielectric, and combination thereof, wherein optionally, such inorganic oxide or nitride is selected from the group consisting of $SiO_2$, $Si_3N_4$, $Al_2O_3$, $ZrO_x$, Al-doped $ZrO_x$, and $HfO_x$, wherein optionally, such molecular dielectric is a self-assembled nanodielectric, and wherein optionally, such polymeric dielectric is selected from the group consisting of a polyolefin, a polyacrylate, a polyimide, a polyester, and a fluoropolymer.

19. The transistor of claim 1, further comprising an electron-injection sublayer deposited between said at least one layer of n-type semiconductor material and the electron electrode, and/or a hole-injection sublayer deposited between said at least one layer of p-type semiconductor material and the hole electrode, and/or a passivation layer covering a top surface of the emissive ambipolar channel.

20. An optoelectronic device for producing an image, the optoelectronic device comprising a plurality of identical or different organic electroluminescent transistors according to claim 1 interconnected to each other and deposited on a substrate.

* * * * *